United States Patent
Rathinasamy et al.

(10) Patent No.: US 11,930,612 B2
(45) Date of Patent: Mar. 12, 2024

(54) CONFIGURABLE MULTI-ORIENTATION DEVICE MOUNT RACK SYSTEM

(71) Applicant: Dell Products L.P., Round Rock, TX (US)

(72) Inventors: Shree Rathinasamy, Round Rock, TX (US); Maunish Shah, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 0 days.

(21) Appl. No.: 17/395,843

(22) Filed: Aug. 6, 2021

(65) Prior Publication Data
US 2023/0042543 A1  Feb. 9, 2023

(51) Int. Cl.
H05K 7/14 (2006.01)
H05K 7/18 (2006.01)

(52) U.S. Cl.
CPC .......... *H05K 7/1489* (2013.01); *H05K 7/1491* (2013.01); *H05K 7/183* (2013.01)

(58) Field of Classification Search
CPC ..... H05K 7/1489; H05K 7/1491; H05K 7/183
See application file for complete search history.

(56) References Cited

U.S. PATENT DOCUMENTS

| | | | | |
|---|---|---|---|---|
| 7,190,574 B2* | 3/2007 | Muenzer | ........... | G06F 1/184 361/679.33 |
| 7,764,859 B2* | 7/2010 | Krampotich | ........ | G02B 6/4452 385/135 |
| 10,264,701 B1* | 4/2019 | Norton | ........... | H05K 7/1488 |
| 2008/0180918 A1* | 7/2008 | Baker | ........... | H05K 7/1488 361/727 |
| 2009/0059486 A1* | 3/2009 | Taylor | ........... | H05K 7/1488 361/679.02 |

* cited by examiner

*Primary Examiner* — James Wu
*Assistant Examiner* — Hung Q Dang
(74) *Attorney, Agent, or Firm* — Joseph Mencher

(57) ABSTRACT

A configurable multi-orientation device mount rack system includes a rack including a first rack shelf. A first device housing is defined by the rack and the first rack shelf. A first device mounting subsystem is included on the rack and that is configurable to mount each of a plurality of devices in the first device housing and to the rack in a first orientation. A second device mounting subsystem is included on the first rack shelf and that is configurable to mount each of a plurality of devices in the first device housing and to the rack in a second orientation that is different than the first orientation. As such, each of a plurality of devices may be positioned in and mounted to the rack in the first device housing in either a "vertical"/side-by-side orientation or a "horizontal"/stacked orientation.

20 Claims, 27 Drawing Sheets

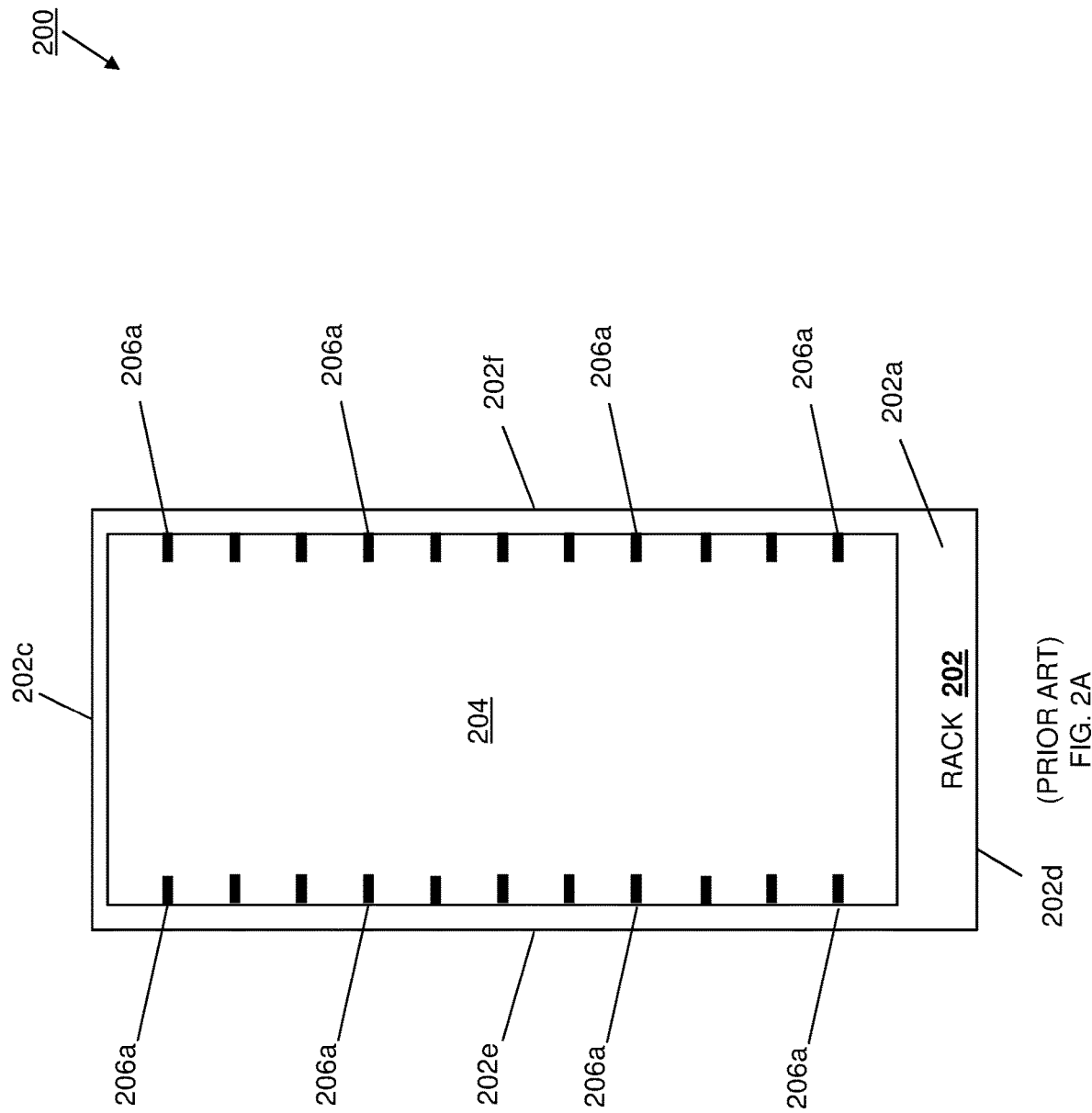

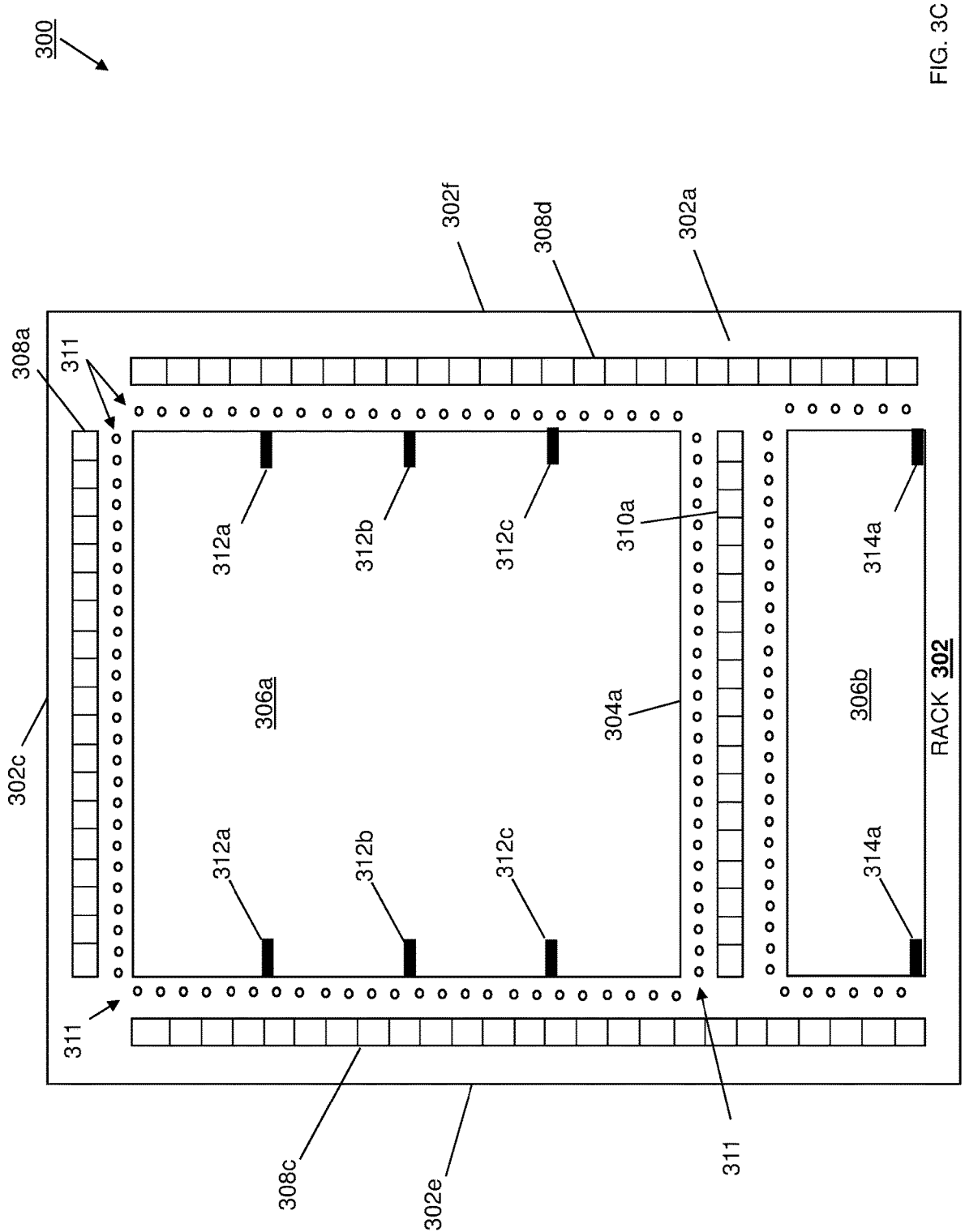

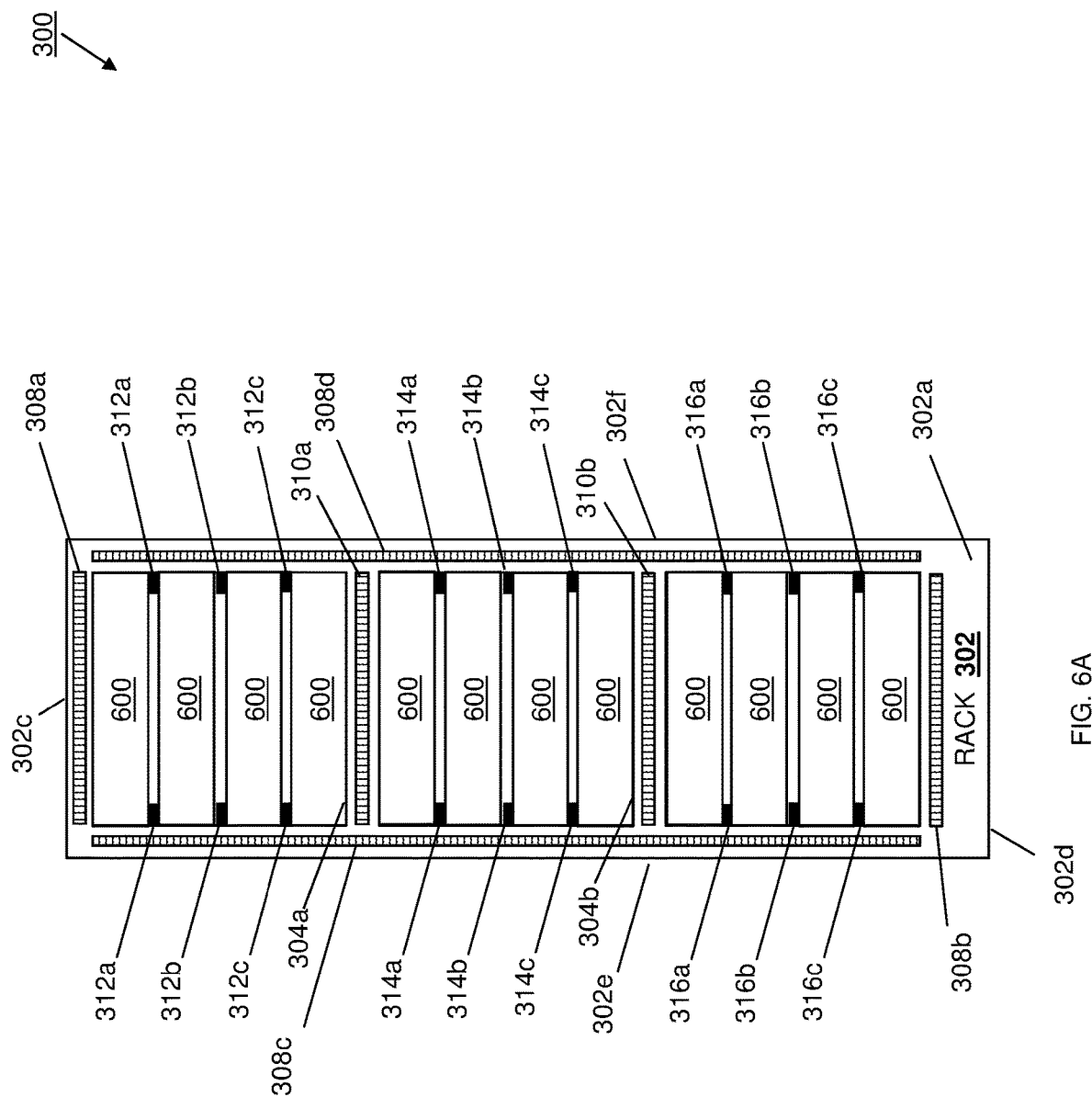

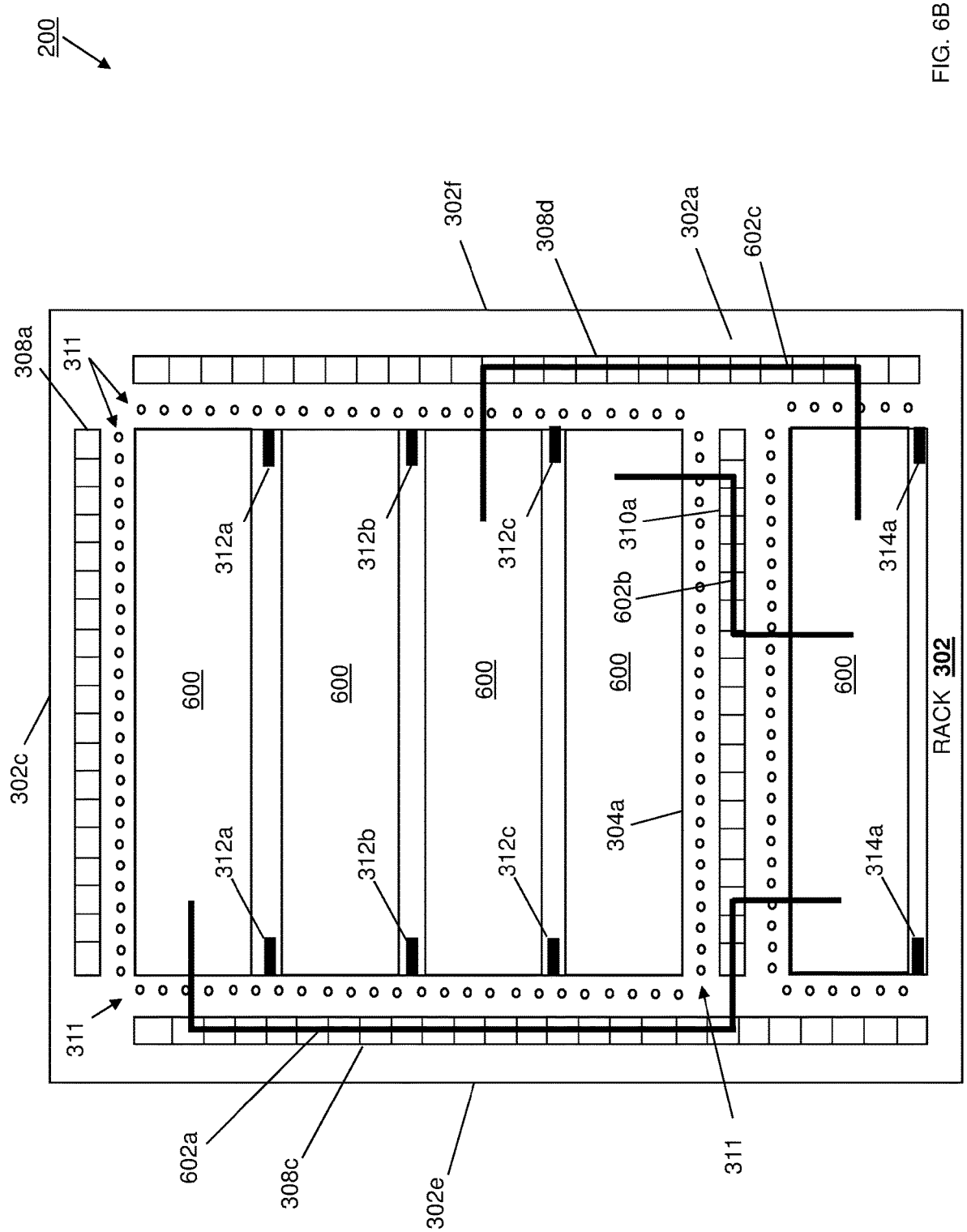

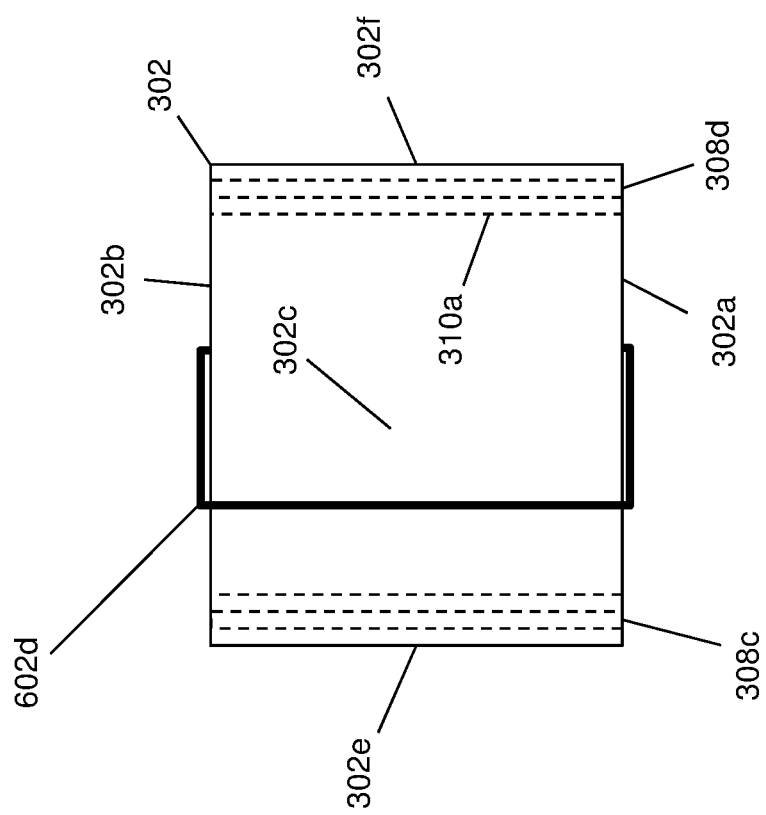

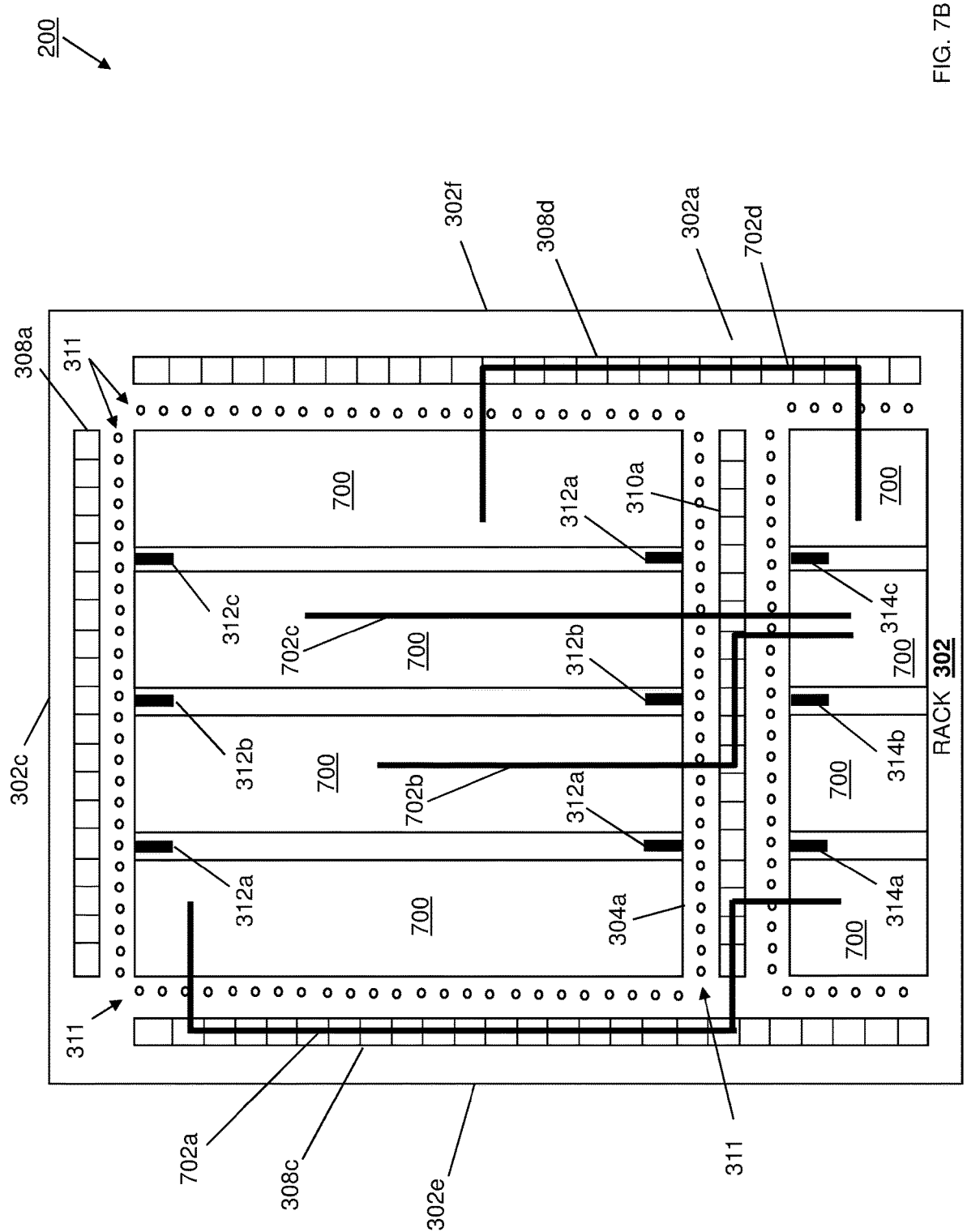

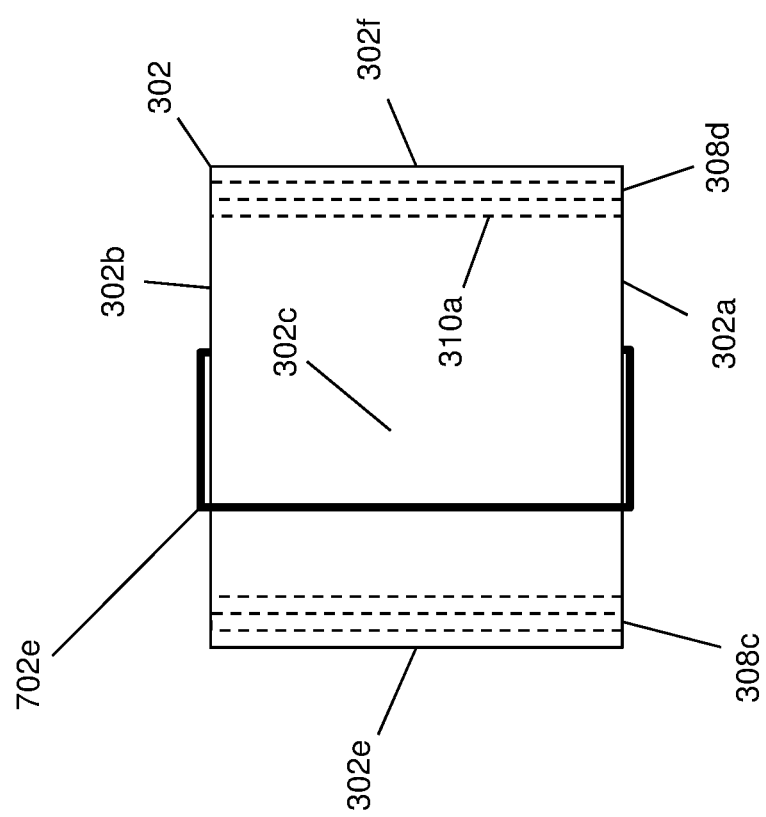

CONFIGURABLE MULTI-ORIENTATION DEVICE MOUNT RACK SYSTEM

BACKGROUND

The present disclosure relates generally to information handling systems, and more particularly to a rack that is configurable to mount information handling systems in multiple orientations in that rack.

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Information handling systems such as server devices, networking devices (e.g., switch devices), storage systems, and/or other computing devices known in the art, are often mounted in racks and connected together. Conventional racks are configured to house devices in a horizontal orientation and stacked one-on-top-of-the-other. For example, FIGS. 2A, 2B, and 2C illustrate a conventional rack system 200 including a rack 202 having a front surface 202a, a rear surface 202b that is located opposite the rack 202 from the front surface 202a, a top wall 202c that extends between the front surface 202a and the rear surface 202b, a bottom wall 202d that is located opposite the rack 202 from the top wall 202c and that extends between the front surface 202a and the rear surface 202b, and a pair of side walls 202e and 202f that are located opposite the rack 202 from each other and that each extend between the front surface 202a, the rear surface 202b, the top wall 202c, and the bottom wall 202d. The rack 202 defines a device housing 204 between the top wall 202c, the bottom wall 202d, and the side walls 202e and 202f, and a plurality of device mount pairs 206a extends from each of the side walls 202e and 202f adjacent the device housing 204. As illustrated in FIG. 2C, a respective device 208 may be positioned in the device housing 204 and mounted to the rack 202 using a subset of the device mount pairs 206a such that a plurality of devices 208 are housed in the rack 202 with each in a horizontal orientation and positioned one-on-top-of-the-other.

Conventional racks like those discussed above suffer from a number of issues. For example, the horizontal orientation of the devices and their positioning one-on-top-of-the-other presents difficulties when positioning the devices in the rack, particular when doing so near the top wall of the rack where the device must be lifted (often by at least two people) the full height of the rack and provided in the horizontal orientation for positioning in the device housing using a device mount pairs, as well as near the bottom wall of the rack where a user must bend down to provide the device in the horizontal orientation for positioning in the device housing using a respective device mount pair. In another example, cabling devices together in the rack can difficult, particularly due to conventional Top Of Rack (TOR) switch devices being positioned adjacent the top wall of the rack and cabled to each of the other devices below them in that rack, which may introduce as many of 160 cables between devices in the rack that can inhibit access to devices and/or the device housing, limit cooling in devices, block visual access to visual indicators (e.g., Light Emitting Devices (LEDs)), block physical access to device ports and other device subsystems, and generally provide an undesirable appearance.

Some conventional racks include cable management systems to address these issues, with those cable management systems often bundling the cabling extending from the devices adjacent the side walls of the rack. However, such cable management systems often require attaching hardware to the rack, extended cable lengths (typically 2-3 additional feet of cabling) to allow the routing, and tend to present difficulties in tracing cables between devices due to the relatively large number of cables that are often bundled in the cable management system. Furthermore, while conventional cable management systems simplify cable routing when the ports on the computing devices in the rack face the same side of the rack, they are limited when ports on devices in the rack that face different sides of the rack (e.g., a first port on a first device that faces a front surface of the rack and a second port on a second device that faces a rear surface of the rack) must be cabled together, which often results in users leaving a device housing slot open (i.e., a 1 rack unit space in the device housing that is free of a device) in order to run cables through the rack from one surface to another via that open device housing slot. Racks have been introduced that extend the conventional dimensions of conventional racks (e.g., from 1070 mm deep and 600 mm wide to up to 1200 mm deep and/or 750 mm wide) in order to provide additional space for cable management, but still suffer from many of the issues discussed above, while also increasing the footprint of the rack in the datacenter.

Accordingly, it would be desirable to provide a rack system that address the issues discussed above.

SUMMARY

According to one embodiment, an Information Handling System (IHS) includes a plurality of devices; a rack; a first rack shelf that is included on the rack; a first device mounting subsystem that is included on the rack and that is configurable to mount each of the plurality of devices between the rack and the first rack shelf in a first orientation; and a second device mounting subsystem that is included on the first rack shelf and that is configurable to mount each of the plurality of devices between the rack and the first rack shelf in a second orientation that is different than the first orientation.

BRIEF DESCRIPTION OF THE DRAWINGS

FIG. 2A is a schematic front view illustrating an embodiment of a conventional rack system.

FIG. 3C is a schematic front view illustrating an embodiment of a portion of the configurable multi-orientation device mount rack system of FIG. 3A in the first/horizontal device mounting configuration.

FIG. 6A is a schematic front view illustrating an embodiment of the configurable multi-orientation device mount rack system of the present disclosure in the first/horizontal device mounting configuration of FIG. 3A housing a plurality of devices.

FIG. 6B is a schematic front view illustrating an embodiment of a portion of the configurable multi-orientation device mount rack system in the first/horizontal device mounting configuration of FIG. 6A with the plurality of devices cabled together.

FIG. 6C is a schematic top view illustrating an embodiment of the configurable multi-orientation device mount rack system in the first configuration of FIGS. 6A and 6B with devices cabled together through a depth of the rack.

FIG. 7B is a schematic front view illustrating an embodiment of a portion of the configurable multi-orientation device mount rack system in the second/vertical device mounting configuration of FIG. 7A with the plurality of devices cabled together.

FIG. 7C is a schematic top view illustrating an embodiment of the configurable multi-orientation device mount rack system in the first configuration of FIGS. 7A and 7B with devices cabled together through a depth of the rack.

DETAILED DESCRIPTION

For purposes of this disclosure, an information handling system may include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, an information handling system may be a personal computer (e.g., desktop or laptop), tablet computer, mobile device (e.g., personal digital assistant (PDA) or smart phone), server (e.g., blade server or rack server), a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, touchscreen and/or a video display. The information handling system may also include one or more buses operable to transmit communications between the various hardware components.

Figure 1:
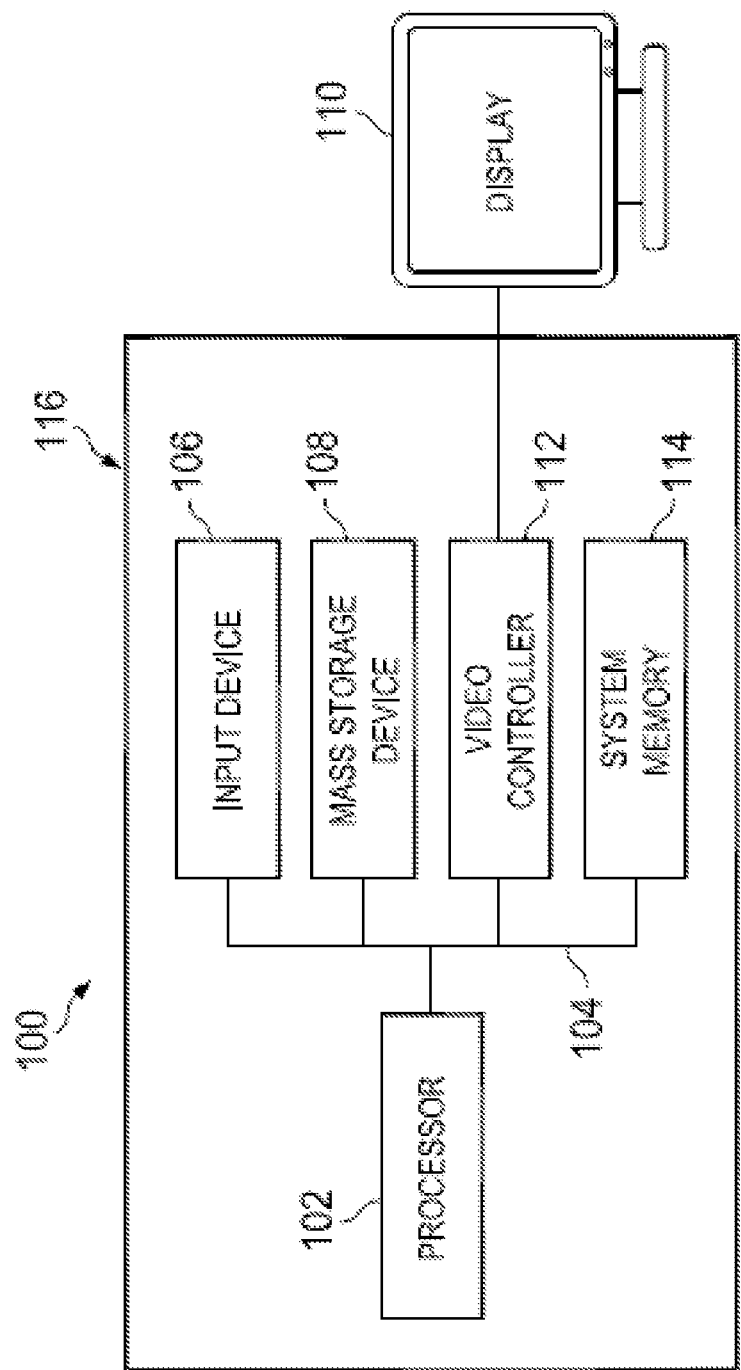
FIG. 1 is a schematic view illustrating an embodiment of an Information Handling System (IHS).

In one embodiment, IHS 100, FIG. 1, includes a processor 102, which is connected to a bus 104. Bus 104 serves as a connection between processor 102 and other components of IHS 100. An input device 106 is coupled to processor 102 to provide input to processor 102. Examples of input devices may include keyboards, touchscreens, pointing devices such as mouses, trackballs, and trackpads, and/or a variety of other input devices known in the art. Programs and data are stored on a mass storage device 108, which is coupled to processor 102. Examples of mass storage devices may include hard discs, optical disks, magneto-optical discs, solid-state storage devices, and/or a variety of other mass storage devices known in the art. IHS 100 further includes a display 110, which is coupled to processor 102 by a video controller 112. A system memory 114 is coupled to processor 102 to provide the processor with fast storage to facilitate execution of computer programs by processor 102. Examples of system memory may include random access memory (RAM) devices such as dynamic RAM (DRAM), synchronous DRAM (SDRAM), solid state memory devices, and/or a variety of other memory devices known in the art. In an embodiment, a chassis 116 houses some or all of the components of IHS 100. It should be understood that other buses and intermediate circuits can be deployed between the components described above and processor 102 to facilitate interconnection between the components and the processor 102.

Figure 3A:
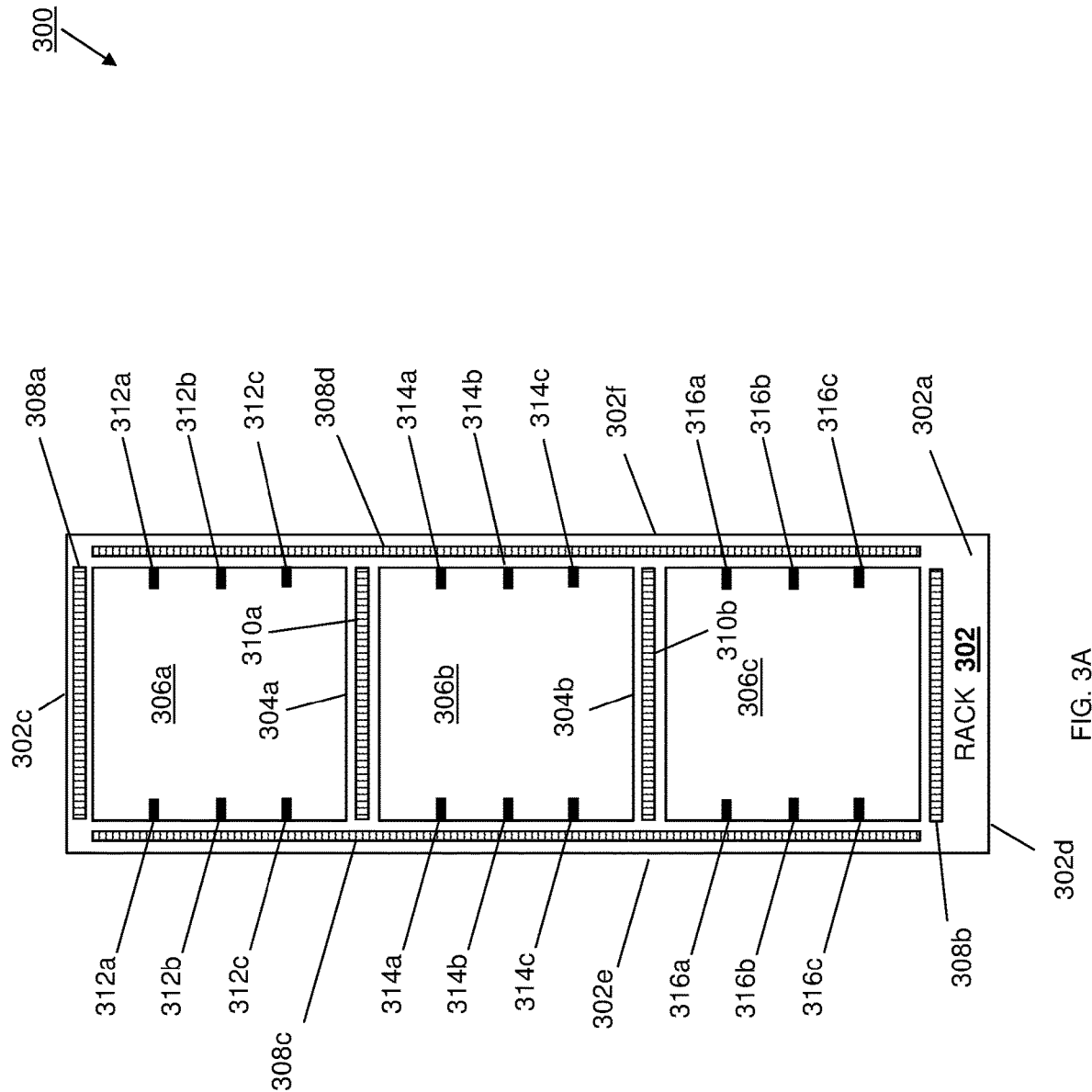
FIG. 3A is a schematic front view illustrating an embodiment of the configurable multi-orientation device mount rack system of the present disclosure in a first/horizontal device mounting configuration.
Figure 3B:
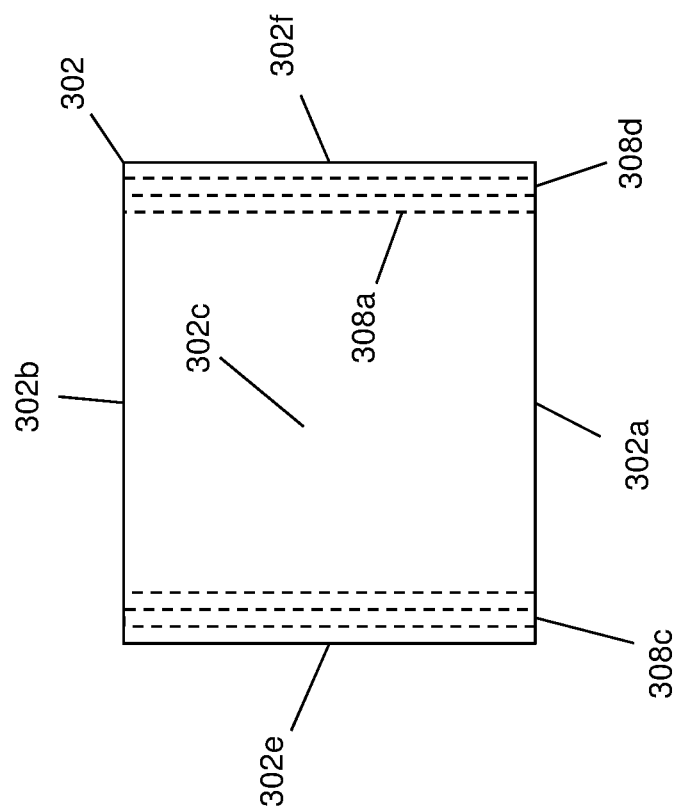
FIG. 3B is a schematic top view illustrating an embodiment of the configurable multi-orientation device mount rack system of FIG. 3A.

Referring now to FIGS. 3A, 3B, and 3C, an embodiment of a configurable multi-orientation device mount rack system 300 is illustrated. In the illustrated embodiment, the configurable multi-orientation device mount rack system 300 includes a rack 302 that, as discussed below, may be provided in a datacenter to house server devices, networking devices (e.g., switch devices), storage systems, and/or other computing devices that would be apparent to one of skill in the art in possession of the present disclosure. The rack 302 includes a front surface 302a, a rear surface 302b that is located opposite the rack 302 from the front surface 302a, a top wall 302c that extends between the front surface 302a and the rear surface 302b, a bottom wall 302d that is located opposite the rack 302 from the top wall 302c and that extends between the front surface 302a and the rear surface 302b, and a pair of side walls 302e and 302f that are located opposite the rack 302 from each other and that each extend between the front surface 302a, the rear surface 302b, the top wall 302c, and the bottom wall 302d. A pair of the rack shelves 304a and 304b are located in a spaced-apart configuration between the top wall 302c and the bottom wall 302d. and extend between the side walls 302e and 302f in order to define a plurality of device housings 306a, 306b, and 306c in the rack 302 that extend through the rack 302 from the front surface 302a to the rear surface 302b.

Figure 2B:
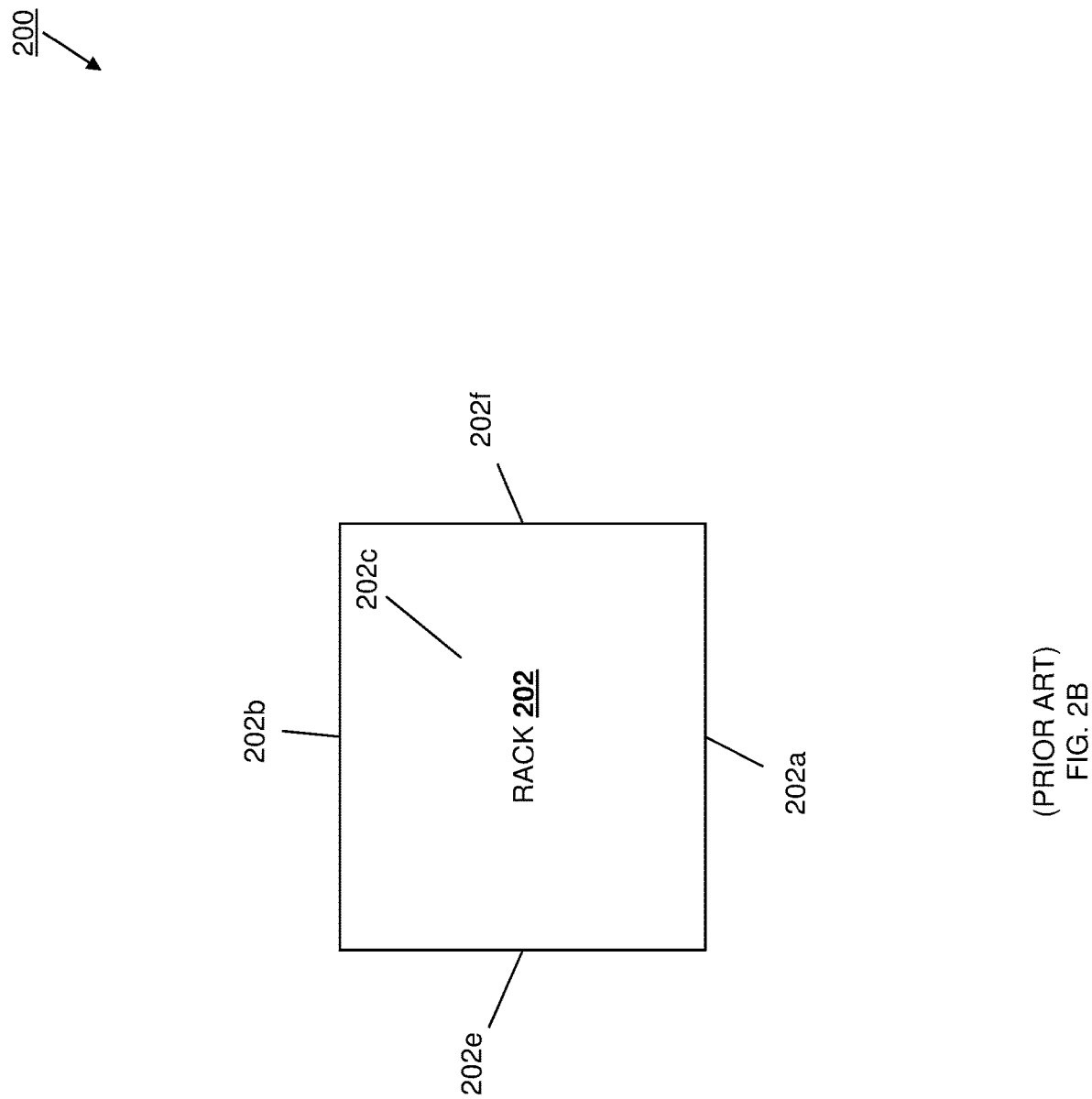
FIG. 2B is a schematic top view illustrating an embodiment of the conventional rack system of FIG. 2A.
Figure 2C:
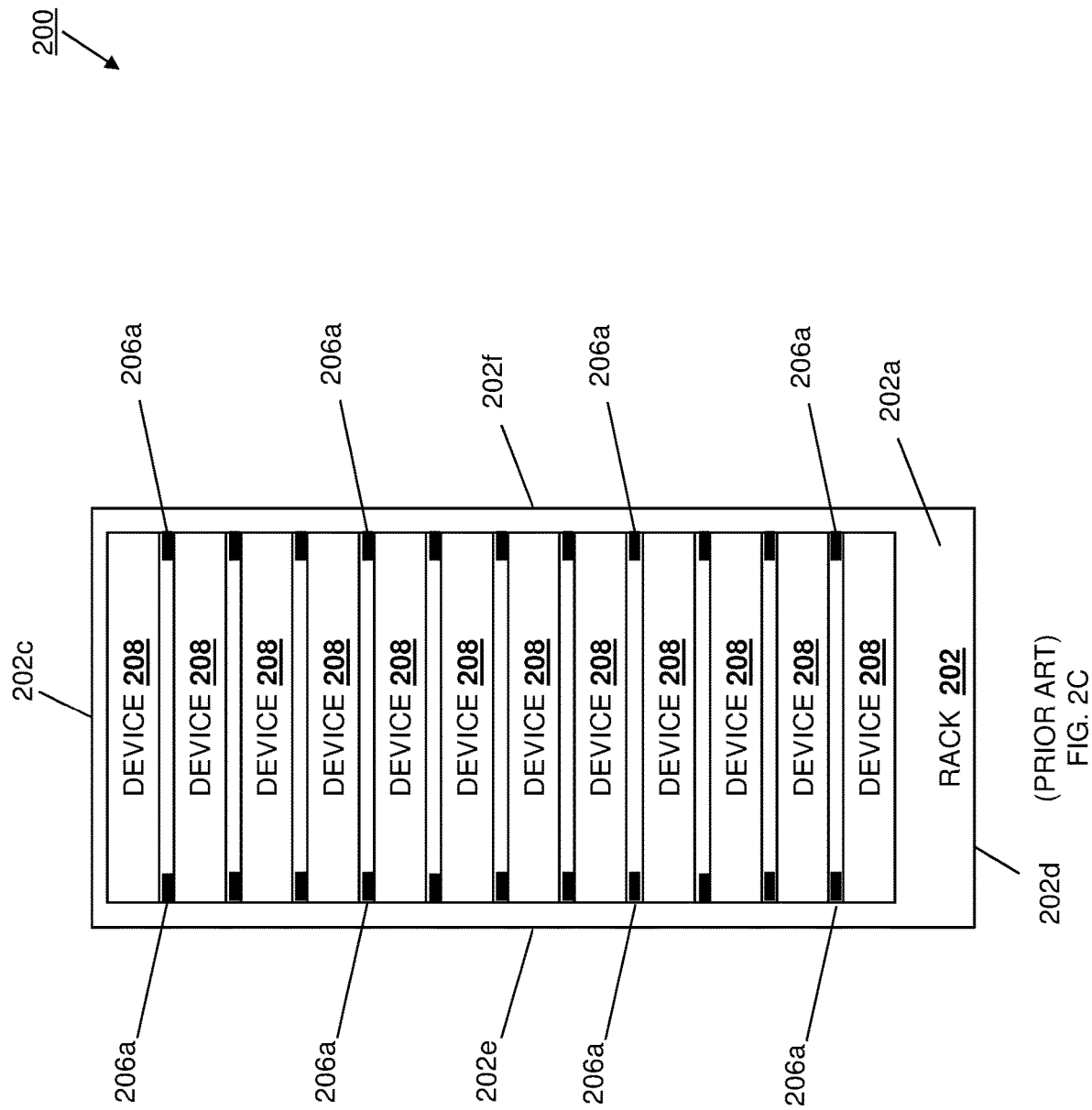
FIG. 2C is a schematic front view illustrating an embodiment of the conventional rack system of FIGS. 2A and 2B housing a plurality of devices in horizontal orientations.

In the examples provide herein, the rack 302 in the configurable multi-orientation device mount rack system 300 is illustrated in a simplified embodiment that includes three device housings 306a, 306b, and 306c for clarity of illustration and discussion below. However, one of skill in the art in possession of the present disclosure will appreciate how the rack 302 in the configurable multi-orientation device mount rack system 300 may define different numbers of devices housings and/or different configurations of devices housing while remaining within the scope of the present disclosure as well. For example, many conventional racks (e.g., like those discussed above with reference to FIGS. 2A-2C) are typically 73.5 inches tall (defining 42 rack units of device housing), 24 inches wide, and 42 inches deep. The inventors of the present disclosure have designed experimental embodiments of the configurable multi-orientation device mount rack system 300 of the present disclosure with a rack that is 76.5 inches tall (e.g., in order to define 42 rack units of space in four 18.3 inch devices housings defined by three rack shelves that are each 1 inch thick), 24 inches wide, and 42 inches deep. However, in embodiments in which at least some of the devices are mounted to the rack in the vertical orientation discussed below, the width of the rack may be between 24-100 inches (a width which may be selected to be divisible by a conventional rack unit height of 1.75 inches). As such, while a simplified version of the rack 302 is illustrated and discussed below, one of skill in the art in possession of the present disclosure will appreciate how the teachings provided herein may be utilized to provide more complex configurable multi-orientation device mount rack systems while remaining within the scope of the present disclosure.

The configurable multi-orientation device mount rack system 300 includes a plurality of cable management subsystems such as the cable management subsystem 308a included on the top wall 302c of the rack 302, the cable management subsystem 308b included on the bottom wall 302d of the rack 302, the cable management subsystem 308c included on the side wall 302e of the rack 302, and the cable management subsystem 308d included on the side wall 302f of the rack 302. Furthermore, the rack shelf 304a also includes a cable management subsystem 310a, and the rack shelf 304b also includes a cable management subsystem 310b. In some embodiments, the cable management subsystems 308a-308d, 310a, and 310b may include clips, straps, and/or other cable coupling elements that are configured to secure to cabling that is routed around the rack 302. However, as illustrated in FIG. 3B, the cable management subsystems may also include cable management channels (e.g., with respective cable management channels illustrated for the cable subsystems 308a, 308c, and 308d) that extend through the rack 302 from its front surface 302a to its rear surface 302b in order to allow cable routing through those cable management subsystems and thus through the depth of the rack 302. As such, while not illustrated in detail in FIG. 3B, one of skill in the art in possession of the present disclosure will appreciate how the cable management subsystems 308b, 310a, and 310b may include similar cable management channels that extend through the depth of the rack 302 while remaining within the scope of the present disclosure.

As illustrated in FIG. 3C, the portions of the rack 302 and rack shelf 304a adjacent the device housing 306a may include mounting elements 311 (e.g., mounting apertures) that are provided about the perimeter of the device housing 306a and that may be configured to mount the devices discussed below to the rack 302 and the rack shelf 304a. Furthermore, while not illustrated or discussed in detail, one of skill in the art in possession of the present disclosure will appreciate how the rack 302, rack shelf 304a, and/or rack shelf 304b may include similar mounting elements about the perimeters of the device housings 306b and 306c as well.

The embodiment in FIGS. 3A and 3C illustrates how the configurable multi-orientation device mount rack system 300 may include a "horizontal" device mounting subsystem on each of the top wall 302a, the bottom wall 302b, and/or the side walls 302e and 302f of the rack 302 and adjacent each of the device housings 306a, 306b, and 306c, with device mount pairs 312a, 312b, and 312c provided on the horizontal device mounting subsystem adjacent the device housing 306a, device mount pairs 314a, 314b, and 314c provided on the horizontal device mounting subsystem adjacent the device housing 306b, and device mount pairs 316a, 316b, and 316c provided on the horizontal device mounting subsystem adjacent the device housing 306c. As will be appreciated by one of skill in the art in possession of the present disclosure, the horizontal device mounting subsystem on each of the side walls 302e and 302f and the device mount pairs 312a-312c, 314a-314c, and 316a-316c may include corresponding features and/or elements that allow the device mount pairs 312a-312c, 314a-314c, and 316a-316c to be connected to the horizontal device mounting subsystem on each of the side walls 302e and 302f in the horizontal device mounting configuration illustrated in FIGS. 3A and 3C, as well as disconnected from the horizontal device mounting subsystem on each of the side walls 302e and 302f.

For example, the device mount pairs 312a-312c, 314a-314c, and 316a-316c may be bolted, screwed, and/or otherwise connected to and disconnected from the horizontal device mounting subsystem on each of the side walls 302e and 302f with the use of a tool. However, in another example, the device mount pairs 312a-312c, 314a-314c, and 316a-316c may be connected to and disconnected from the horizontal device mounting subsystem on each of the side walls 302e and 302f without the use of a tool (e.g., by sliding any particular device mount pair into corresponding slots defined by the horizontal device mounting subsystem on each of the side walls 302e and 302f). However, while a few specific examples are provided, one of skill in the art in possession of the present disclosure will appreciate how the connection/disconnection of the device mount pairs 312a-312c, 314a-314c, and 316a-316c and the horizontal device mounting subsystem on each of the side walls 302e and 302f may be accomplished using a variety of tooled and toolless connection techniques known in the art, any of which will fall within the scope of the present disclosure. Furthermore, any of the rack 302, the rack shelves 304a and 304b, and the horizontal device mounting subsystem may include routing elements to facilitate the positioning of devices between rack mount pairs, a rack mount pair and the rack 302, and/or a rack mount pair and a rack shelf, which is discussed in further detail below.

One of skill in the art in possession of the present disclosure will recognize that the device mount pairs 312a-312c, 314a-314c, and 316a-316c are illustrated as connected to the horizontal device mounting subsystem on each of the side walls 302e and 302f in a configuration that provides a 1 rack unit space between rack mount pairs, a rack mount pair and the rack 302, and/or a rack mount pair and a rack shelf. However, one of skill in the art in possession of the present disclosure will appreciate how the device mount pairs 312a-312c, 314a-314c, and 316a-316c may be connected to the horizontal device mounting subsystem on each of the side walls 302e and 302f in a configuration that allows larger rack unit spaces between rack mount pairs, a rack mount pair and the rack 302, and/or a rack mount pair and a rack shelf (e.g., 2 rack units, 4 rack units, or larger) while remaining within the scope of the present disclosure as well.

Figure 3D:
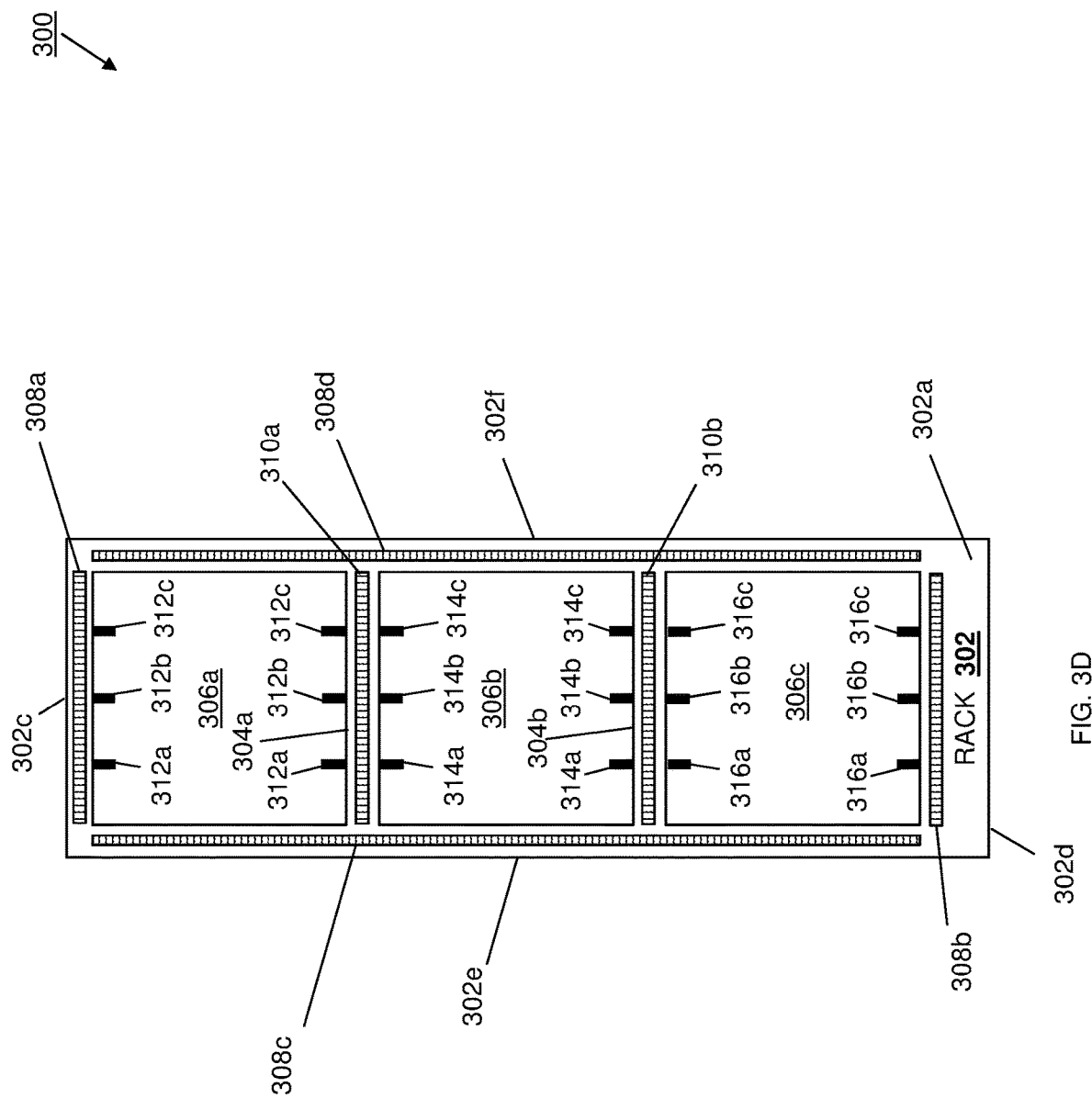
FIG. 3D is a schematic front view illustrating an embodiment of the configurable multi-orientation device mount rack system of the present disclosure in a second/vertical device mounting configuration.
Figure 3E:
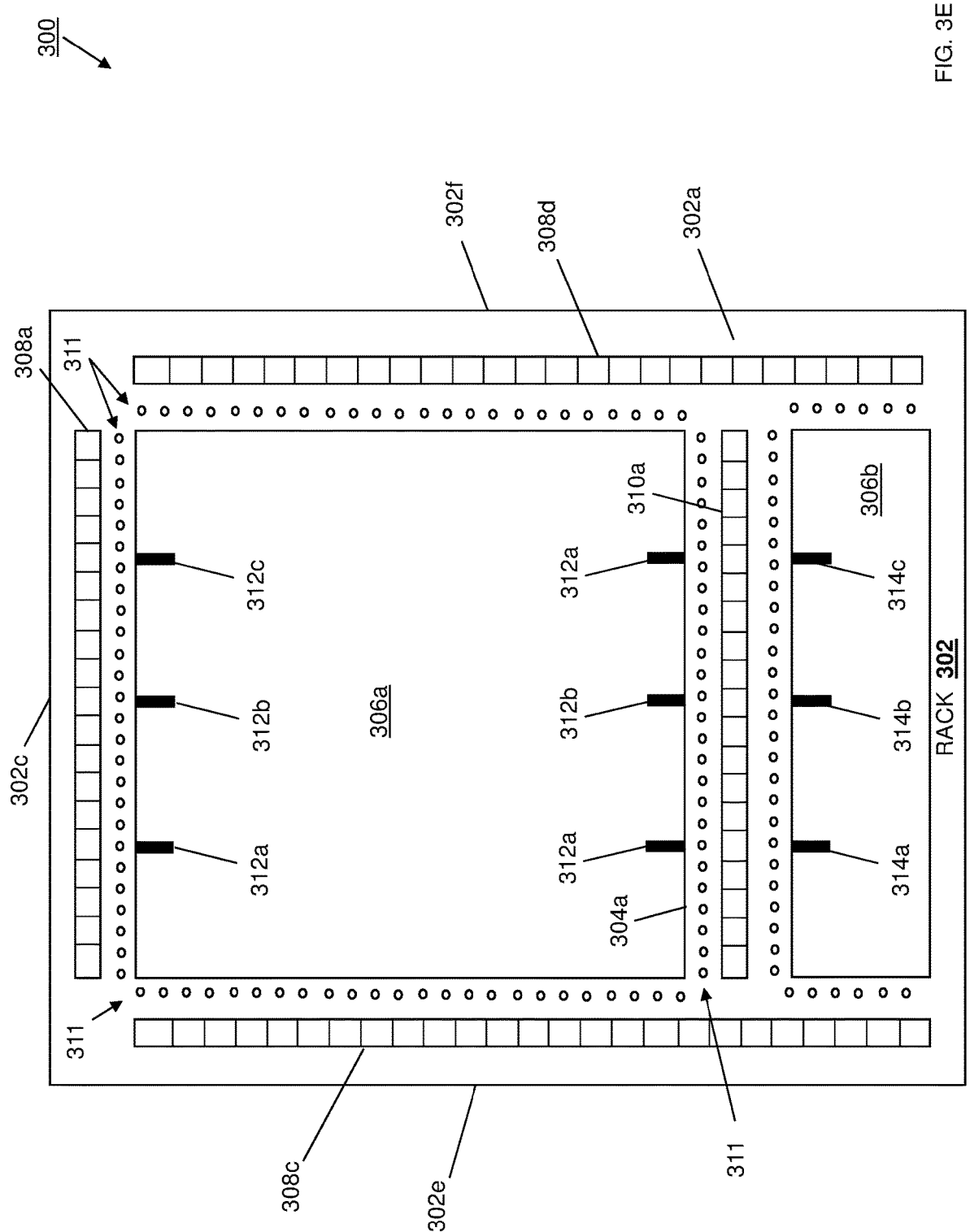
FIG. 3E is a schematic front view illustrating an embodiment of a portion of the configurable multi-orientation device mount rack system of FIG. 3D in the second/vertical device mounting configuration.

The embodiment in FIGS. 3D and 3E illustrates how the configurable multi-orientation device mount rack system 300 also includes a "vertical" device mounting subsystem on the top wall 302c, the bottom wall 302d, and/or the side walls 302e and 302f of the rack 302, as well as on the rack shelves 304a and 304b, and adjacent each of the device housings 306a, 306b, and 306c, with the device mount pairs 312a, 312b, and 312c discussed above provided on the vertical device mounting subsystem adjacent the device housing 306a, the device mount pairs 314a, 314b, and 314c discussed above provided on the vertical device mounting subsystem adjacent the device housing 306b, and the device mount pairs 316a, 316b, and 316c discussed above provided on the vertical device mounting subsystem adjacent the device housing 306c. As will be appreciated by one of skill in the art in possession of the present disclosure, the vertical device mounting subsystem on top wall 302c and the bottom wall 302d of the rack 302, as well as on the rack shelves 304a and 304b, and the device mount pairs 312a-312c, 314a-314c, and 316a-316c may include corresponding features and/or elements that allow the device mount pairs 312a-312c, 314a-314c, and 316a-316c to be connected to the vertical device mounting subsystem on any of the top wall 302c and the bottom wall 302d of the rack 302, as well as on the rack shelves 304a and 304b, in the vertical device mounting configuration illustrated in FIGS. 3D and 3E, as well as disconnected from the vertical device mounting subsystem on any of the top wall 302c and the bottom wall 302d of the rack 302, as well as on the rack shelves 304a and 304b.

For example, the device mount pairs 312a-312c, 314a-314c, and 316a-316c may be bolted, screwed, and/or otherwise connected to and disconnected from the vertical device mounting subsystem on any of the top wall 302c and the bottom wall 302d of the rack 302, as well as on the rack shelves 304a and 304b, with the use of a tool. However, in another example, the device mount pairs 312a-312c, 314a-314c, and 316a-316c may be connected to and disconnected from the vertical device mounting subsystem on any of the top wall 302c and the bottom wall 302d of the rack 302, as well as on the rack shelves 304a and 304b, without the use of a tool (e.g., by sliding any particular device mount pair into corresponding slots defined by the horizontal device mounting subsystem on any of the top wall 302c and the bottom wall 302d of the rack 302, as well as on the rack shelves 304a and 304b). However, while a few specific examples are provided, one of skill in the art in possession of the present disclosure will appreciate how the connection/disconnection of the device mount pairs 312a-312c, 314a-314c, and 316a-316c and the vertical device mounting subsystem on any of the top wall 302c and the bottom wall 302d of the rack 302, as well as on the rack shelves 304a and 304b, may be accomplished using a variety of tooled and toolless connection techniques known in the art, any of which will fall within the scope of the present disclosure. Furthermore, any of the rack 302, the rack shelves 304a and 304b, and the horizontal device mounting subsystem may include routing elements to facilitate the positioning of devices between rack mount pairs, a rack mount pair and the rack 302, and/or a rack mount pair and a rack shelf, which is discussed in further detail below.

Furthermore, one of skill in the art in possession of the present disclosure will recognize that the device mount pairs 312a-312c, 314a-314c, and 316a-316c are illustrated as connected to the vertical device mounting subsystem on any of the top wall 302c and the bottom wall 302d of the rack 302, as well as on the rack shelves 304a and 304b, in a configuration that provides a 1 rack unit space between rack mount pairs, and/or a rack mount pair and the rack 302. However, one of skill in the art in possession of the present disclosure will appreciate how the device mount pairs 312a-312c, 314a-314c, and 316a-316c may be connected to the vertical device mounting subsystem on any of the top wall 302c and the bottom wall 302d of the rack 302, as well as on the rack shelves 304a and 304b, in a configuration that allows larger rack unit spaces between rack mount pairs, and/or a rack mount pair and the rack 302 (e.g., 2 rack units, 4 rack units, or larger) while remaining within the scope of the present disclosure as well.

Thus, as discussed in further detail below, the horizontal device mounting subsystem and vertical mounting subsystem provided in the configurable multi-orientation device mount rack system 300 allow any of the device housings 306a, 306b, and 306c to be configured to house devices in either horizontal device orientations (e.g., as illustrated in FIGS. 3A and 3C) or vertical device orientation (e.g., as illustrated in FIGS. 3D and 3E), and one of skill in the art in possession of the present disclosure will appreciate how a user of the configurable multi-orientation device mount rack system 300 may configure and reconfigure the horizontal device mounting subsystem and vertical device mounting subsystem on the rack 302 and/or rack shelves 304a and 304b as desired in order to provide for the mounting of devices in the rack 302 in any of a variety of horizontal device orientation and/or vertical device orientation configurations, only a few of which are explicitly illustrated and discussed herein. However, while a specific configurable multi-orientation device mount rack system 300 has been illustrated and described, one of skill in the art in possession of the present disclosure will recognize that the configurable multi-orientation device mount rack system 300 of the present disclosure may include a variety of components and component configurations while remaining within the scope of the present disclosure as well.

Figure 4A:
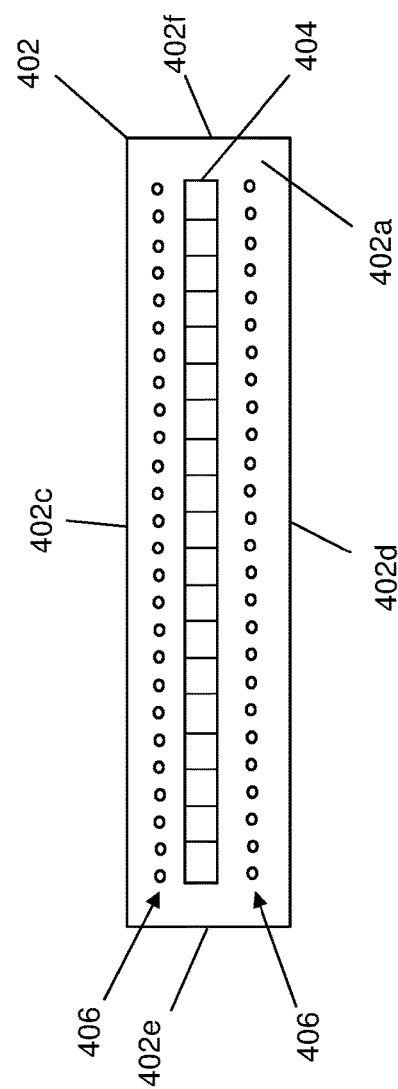
FIG. 4A is a schematic front view of a configurable multi-orientation device mount rack shelf that may be utilized to provide the configurable multi-orientation device mount rack system of FIGS. 3A-3E.
Figure 4B:
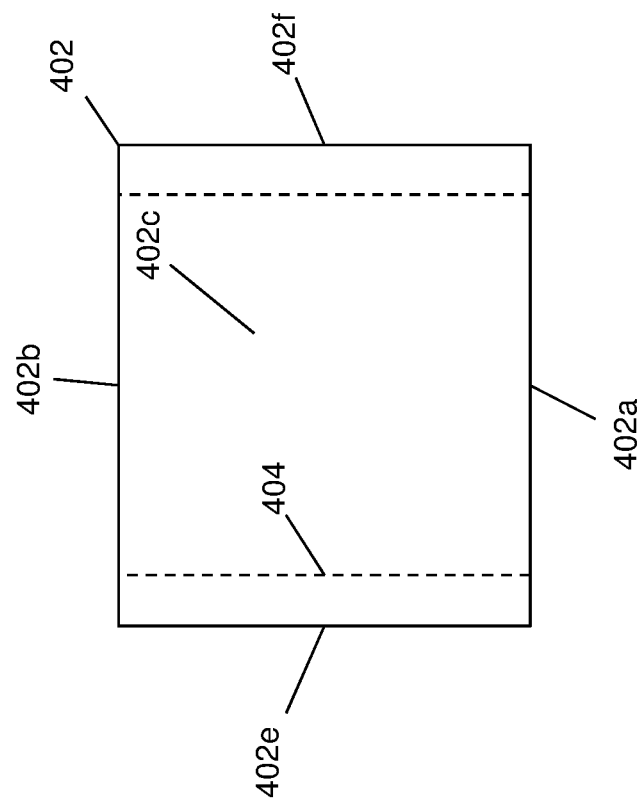
FIG. 4B is a schematic top view of the configurable multi-orientation device mount rack shelf of FIG. 4A.

For example, while the rack shelves 304a and 304b are illustrated and discussed above as being integrated as part of the rack 302, in other embodiments the rack shelves 304a and 304b may be connected to a conventional rack (e.g., the rack 202 in the conventional rack system 200 discussed above with reference to FIGS. 2A-2C) while remaining within the scope of the present disclosure. With reference to FIGS. 4A and 4B, a configurable multi-orientation device mount rack shelf 400 is illustrated that includes a chassis 402 having front surface 402a, a rear surface 402b that is located opposite the chassis 402 from the front surface 402a, a top surface 402c that extends between the front surface 402a and the rear surface 402b, a bottom surface 402d that is located opposite the chassis 402 from the top surface 402c and that extends between the front surface 402a and the rear surface 402b, and a pair of side surfaces 402e and 402f that are located opposite the chassis 402 from each other and that each extend between the front surface 402a, the rear surface 402b, the top surface 402c, and the bottom surface 402d.

The configurable multi-orientation device mount rack shelf 400 includes a cable management subsystem 404. In some embodiments, the cable management subsystem 404 may be similar to the cable management subsystems 310a and/or 310b discussed above with reference to FIGS. 3A-3E, and thus may include clips, straps, and/or other cable coupling elements that are configured to secure to cabling that is routed along the configurable multi-orientation device mount rack shelf 400. However, as illustrated in FIG. 4B, the cable management subsystem 404 may also include a cable management channel that extends through the chassis 402 from the front surface 402a to the rear surface 402b of the chassis 402 in order to allow cable routing through the cable management subsystem 404 and thus through the depth of the configurable multi-orientation device mount rack shelf 400. As illustrated in FIG. 4A, the configurable multi-orientation device mount rack shelf 400 may include mounting elements 406 (e.g., mounting apertures) that are provided on the front surface 402a of the chassis 402 and adjacent each of the top surface 402c of the chassis 402 and the bottom surface 402d of the chassis 402 that may be configured to mount the devices discussed below to the configurable multi-orientation device mount rack shelf 400.

As will be appreciated by one of skill in the art in possession of the present disclosure, the chassis 402 of the configurable multi-orientation device mount rack shelf 400 may includes dimensions and mounting subsystems that allow it to be mounted to a conventional rack. For example, with reference to the conventional rack system 200 discussed above with reference to FIGS. 2A-2C. the chassis 402 of the configurable multi-orientation device mount rack shelf 400 may be configured to be mounted in a 1 rack unit space in the device housing 204 of the rack 202, and thus a pair of configurable multi-orientation device mount rack shelves 400 may be provided in 1 rack unit slots in the device housing 204 of the rack 202 with a spacing that allow for the mounting of devices between them in the vertical device mounting orientation discussed in further detail below. However, while a particular use of the configurable multi-orientation device mount rack shelf 400 has been described, one of skill in the art in possession of the present disclosure will appreciate how the configurable multi-orientation device mount rack shelf 400 may include a variety of features that allow its mounting to a conventional rack system in order to allow that conventional rack system to be configured for the vertical device mounting discussed below.

Figure 5:
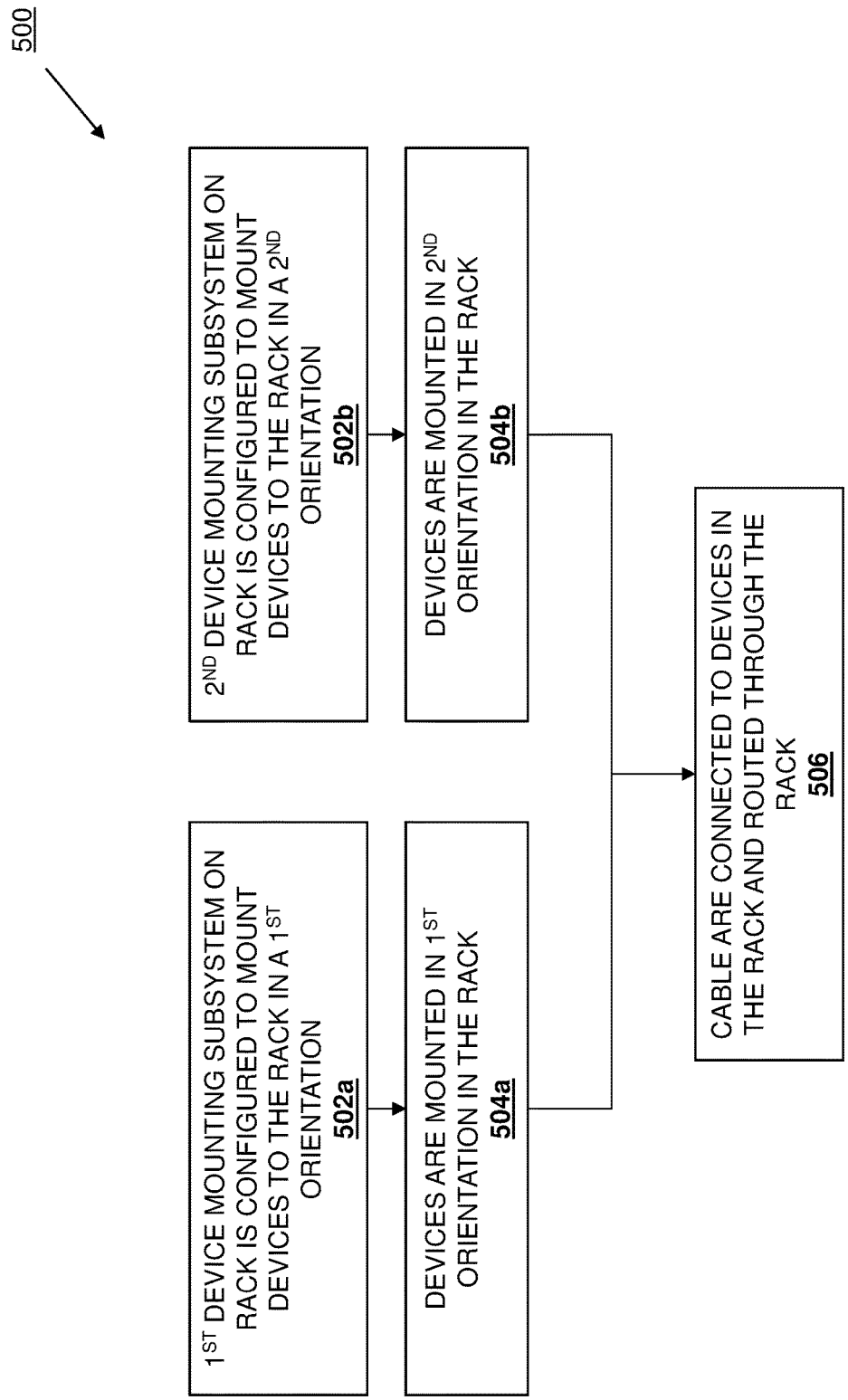
FIG. 5 is a flow chart illustrating an embodiment of a method for mounting devices in multiple orientations in a rack.

Referring now to FIG. 5, an embodiment of a method 500 mounting devices in multiple orientations in a rack is illustrated. As discussed below, the systems and methods of the present disclosure provide for the configuration of multiple device housings in a rack to mount devices to the rack in either a horizontal device orientation or a vertical device orientation, along with cable management subsystems that simplify the routing of cabling through the rack and between those devices. For example, the configurable multi-orientation device mount rack system of the present disclosure may include a rack having a first rack shelf. A first device housing is defined by the rack and the first rack shelf. A first device mounting subsystem is included on the rack and that is configurable to mount each of a plurality of devices in the first device housing and to the rack in a first orientation. A second device mounting subsystem is included on the first rack shelf and that is configurable to mount each of a plurality of devices in the first device housing and to the rack in a second orientation that is different than the first orientation. As such, each of a plurality of devices may be positioned in and mounted to the rack in the first device housing in either a "vertical"/side-by-side orientation or a "horizontal"/stacked orientation. As will be appreciated by one of skill in the art in possession of the present disclosure, the configurable multi-orientation device mount rack system of the present disclosure provides a user the ability to position devices in the rack in more ergonomic and efficient device orientations that allow for more efficient and ergonomic device positioned, cable routing, and device movement within the rack.

The method 500 may begin at block 502a where a first device mounting subsystem on a rack is configured to mount devices to the rack in a first orientation, and/or may begin at block 502*b* where a second device mounting subsystem on the rack is configured to mount devices to the rack in a second orientation. In an embodiment, at block 502*a*, a user of the configurable multi-orientation device mount rack system 300 may configure the horizontal device mounting subsystem on the rack 302 in order to provide any of the device mount pairs 312*a*-312*c*, 314*a*-314*c*, and/or 316*a*-316*c* adjacent the device housings 306*a*, 306*b*, and/or 306*c*, respectively, in the horizontal device mounting configuration illustrated in FIG. 3A. In the specific example provided below with reference to FIGS. 6A, 6B, and 6C, the horizontal device mounting subsystem on the rack 302 has been configured to provide all of the device mount pairs 312*a*-312*c*, 314*a*-314*c*, and 316*a*-316*c* adjacent the device housings 306*a*, 306*b*, and 306*c*, respectively, in the horizontal device mounting configuration.

Similarly, at block 502*b*, a user of the configurable multi-orientation device mount rack system 300 may configure the vertical device mounting subsystem on the rack 302 and rack shelves 304*a* and 304*b* in order to provide any of the device mount pairs 312*a*-312*c*, 314*a*-314*c*, and/or 316*a*-316*c* adjacent the device housings 306*a*, 306*b*, and/or 306*c*, respectively, in the vertical device mounting configuration illustrated FIG. 3D. In the specific example provided below with reference to FIGS. 7A, 7B, and 7C, the vertical device mounting subsystem on the rack 302 has been configured to provide all of the device mount pairs 312*a*-312*c*, 314*a*-314*c*, and 316*a*-316*c* adjacent the device housings 306*a*, 306*b*, and 306*c*, respectively, in the vertical device mounting configuration.

However, blocks 502*a* and 502*b* may be also be performed together to configure the horizontal device mounting subsystem on the rack 302 in order to provide some of the device mount pairs 312*a*-312*c*, 314*a*-314*c*, and/or 316*a*-316*c* adjacent the device housings 306*a*, 306*b*, and/or 306*c*, respectively, in the horizontal device mounting configuration illustrated in FIG. 3A, as well as to configure the vertical device mounting subsystem on the rack 302 and rack shelves 304*a* and 304*b* in order to provide some of the device mount pairs 312*a*-312*c*, 314*a*-314*c*, and/or 316*a*-316*c* adjacent the device housings 306*a*, 306*b*, and/or 306*c*, respectively, in the vertical device mounting configuration illustrated FIG. 3D. In the specific example provided below with reference to FIGS. 8A, 8B, and 8C, the horizontal device mounting subsystem on the rack 302 has been configured to provide the device mount pairs 312*a*-312*c* and 316*a*-316*c* adjacent the device housings 306*a* and 306*c*, respectively, in the horizontal device mounting configuration, and the vertical device mounting subsystem on the rack 302 has been configured to provide the device mount pairs 314*a*-314*c* adjacent the device housing 306*b* in the vertical device mounting configuration.

In the specific example provided below with reference to FIGS. 9A, 9B, and 9C, the horizontal device mounting subsystem on the rack 302 has been configured to provide the device mount pairs 314*a*-314*c* adjacent the device housing 306*b* in the horizontal device mounting configuration, and the vertical device mounting subsystem on the rack 302 has been configured to provide the device mount pairs 312*a*-312*c* and 316*a*-316*c* adjacent the device housings 306*a* and 306*c*, respectively, in the vertical device mounting configuration. However, while a few specific examples are provided, one of skill in the art in possession of the present disclosure will appreciate how other horizontal device mounting subsystem and vertical device mounting subsystem configurations may be provided (e.g., to provide the device mount pairs 312*a*-312*c* and 314*a*-314*c* adjacent the device housings 306*a* and 306*b* in the vertical device mounting configuration and provide the device mount pairs 316*a*-316*c* adjacent the device housing 306*c* in the horizontal device mounting configuration, to provide the device mount pairs 312*a*-312*c* adjacent the device housing 306*a* in the horizontal device mounting configuration and provide the device mount pairs 314*a*-314*c* and 316*a*-316*c* adjacent the device housings 306*b* and 306*c* in the vertical device mounting configuration, etc.)

The method 500 then proceeds to block 504*a* where devices may be mounted in the first orientation in the rack, and/or block 504*b* where devices may be mounted in the second orientation in the rack. In an embodiment, at block 504*a* and/or 504*b*, devices may be mounted in the device housings 306*a*-306*c* in the rack 302 in an orientation that corresponds to the device mounting orientation configured for the device mount pairs adjacent that device housing. Referring back to the specific example illustrated in FIGS. 6A-6C, at block 504*a*, each of a plurality of devices 600 may be positioned in a horizontal orientation and then moved into the device housings 306*a*, 306*b*, and 306*c* such that they engage the device mount pairs, rack, and/or rack shelf adjacent that device housing and, once positioned in that device housing, may be secured to the rack 302 via adjacent mounting elements 311 on the rack 302.

As such, a device 600 is illustrated as positioned in the device housing 306*a* and in engagement with the top wall 302*c* and side walls 302*e* and 302*f* of the rack 302 and the device mount pair 312*a*, a device 600 is illustrated as positioned in the device housing 306*a* and in engagement with the side walls 302*e* and 302*f* of the rack 302 and the device mount pairs 312*a* and 312*b*, a device 600 is illustrated as positioned in the device housing 306*a* and in engagement with the side walls 302*e* and 302*f* of the rack 302 and the device mount pairs 312*b* and 312*c*, and a device 600 is illustrated as positioned in the device housing 306*a* and in engagement with the side walls 302*e* and 302*f* of the rack 302, the device mount pair 312*c*, and the rack shelf 304*a*. Furthermore, while not described in detail, one of skill in the art in possession of the present disclosure will recognize that the devices 600 are positioned in the device housings 306*b* and 306*c* in a similar manner. As will be appreciated by one of skill in the art in possession of the present disclosure, the horizontal device orientations of the devices 600 in the rack 302 illustrated in FIGS. 6A-6C are similar to the horizontal device orientations of the devices 208 positioned in the rack 202 in the conventional rack system 200 discussed above with reference to FIGS. 2A-2C. However, as discussed below, the cable management subsystems included on the rack 302 with the configuration illustrated in FIGS. 6A and 6B provide benefits over conventional rack systems.

Figure 7A:
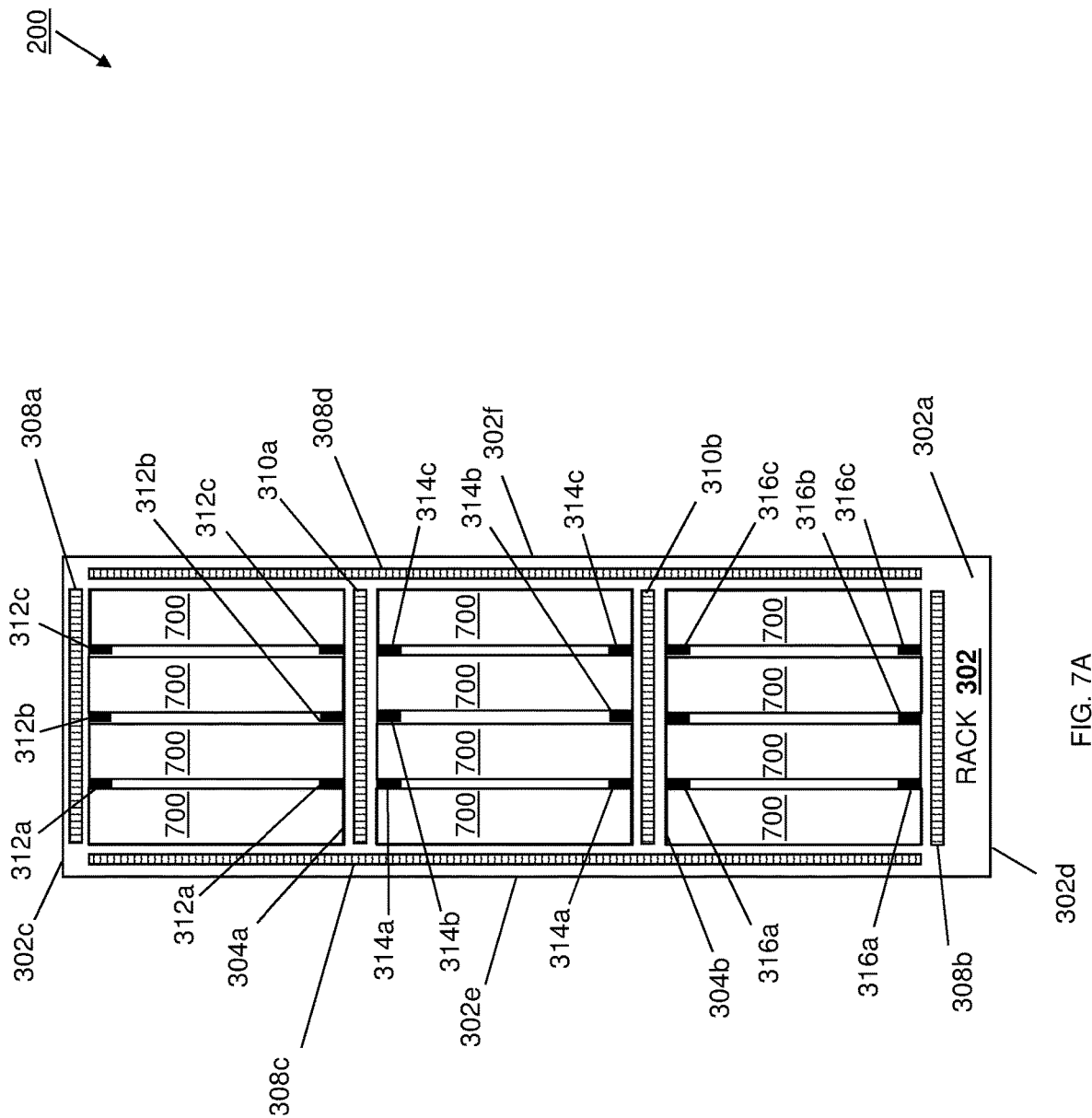
FIG. 7A is a schematic front view illustrating an embodiment of the configurable multi-orientation device mount rack system of the present disclosure in the second/vertical device mounting configuration of FIG. 3A housing a plurality of devices.

Referring back to the specific example illustrated in FIGS. 7A-7C, at block 504*b*, each of a plurality of devices 700 may be positioned in a vertical orientation and then moved into the device housings 306*a*, 306*b*, and 306*c* such that they engage the device mount pairs, rack, and/or rack shelf adjacent that device housing and, once positioned in that device housing, may be secured to the rack 302 via adjacent mounting elements 311 on the rack 302. As will be appreciated by one of skill in the art in possession of the present disclosure, the securing of the device 700 in the vertical orientation to the rack 302 may only require securing to mounting element 311 closer to the top wall 302*c* of the rack 302 (e.g., the "top" of that device relative to its vertical orientation), and securing to mounting elements 311 closer to the bottom wall 302d of the rack 302 (e.g., the "bottom" of that device relative to its vertical orientation) may be optional. As such, a device 700 is illustrated as positioned in the device housing 306a and in engagement with the top wall 302c and the side wall 302e of the rack 302, the device mount pair 312a, and the rack shelf 304a; a device 700 is illustrated as positioned in the device housing 306a and in engagement with the top wall 302c of the rack 302, the device mount pairs 312a and 312b, and the rack shelf 304a; a device 700 is illustrated as positioned in the device housing 306a and in engagement with the top wall 302c of the rack 302, the device mount pairs 312b and 312c, and the rack shelf 304a; and a device 700 is illustrated as positioned in the device housing 306a and in engagement with the top wall 302c and the side wall 302f of the rack 302, the device mount pair 312c, and the rack shelf 304a. Furthermore, while not described in detail, one of skill in the art in possession of the present disclosure will recognize that the devices 700 are positioned in the device housings 306b and 306c in a similar manner.

As will be appreciated by one of skill in the art in possession of the present disclosure, the vertical device mounting orientations of the devices 700 introduce several benefits associated with the use of the rack 302. For examples, the devices 700 may be more easily installed in and removed from the rack 302, particular in the portion of the device housing 306a adjacent the top wall 302c of the rack 302 that allows devices 700 to be lifted to lower height before being supported by the rack shelf 304a for positioning in the device housing 306a, and in the device housing 306c adjacent the bottom wall 302d of the rack 302 that reduces the bending required by a user to position devices 700 in the device housing 306c. As will be appreciated by one of skill in the art in possession of the present disclosure, many rack mounted devices can weigh over 50 lbs (with some 2 rack unit devices weighing over 70 to 80 lbs), and while conventional rack systems often require two users to position such devices near the top wall of the rack (or remove them therefrom), the vertical device mounting orientations of such devices in the rack 302 may allow a single user to position (or remove) such devices near the top wall 302c or bottom wall 302d of the rack 302 due to the reduction in the height needed to lift that device before it is supported by the rack shelf 304a or bend over to place that device in the device housing 306c, the elimination of the requirement that that device be oriented horizontally before positioning them in the rack 302 (as the vertical orientation of the devices 700 provides for better control of the weight of those devices 700 when positioning them in the rack 302), and the elimination of horizontal rail systems that require more precise device alignments in order to accomplish the positioning of the devices 700 in the rack 302.

Figure 8A:
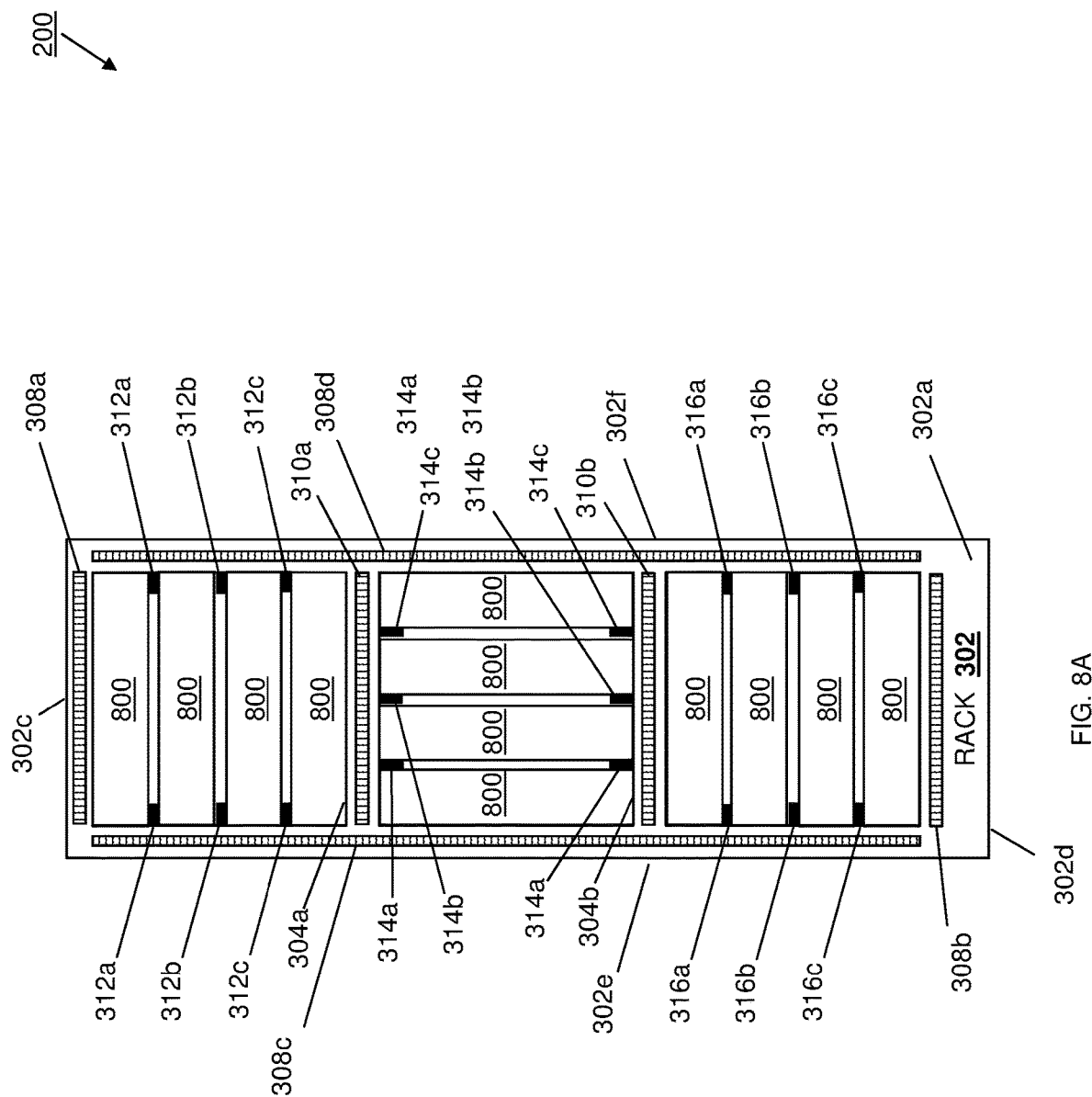
FIG. 8A is a schematic front view illustrating an embodiment of the configurable multi-orientation device mount rack system of the present disclosure with a combination of the first/horizontal device mounting configuration of FIG. 3A and the second/vertical device mounting configuration of FIG. 3D housing a plurality of devices.
Figure 8B:
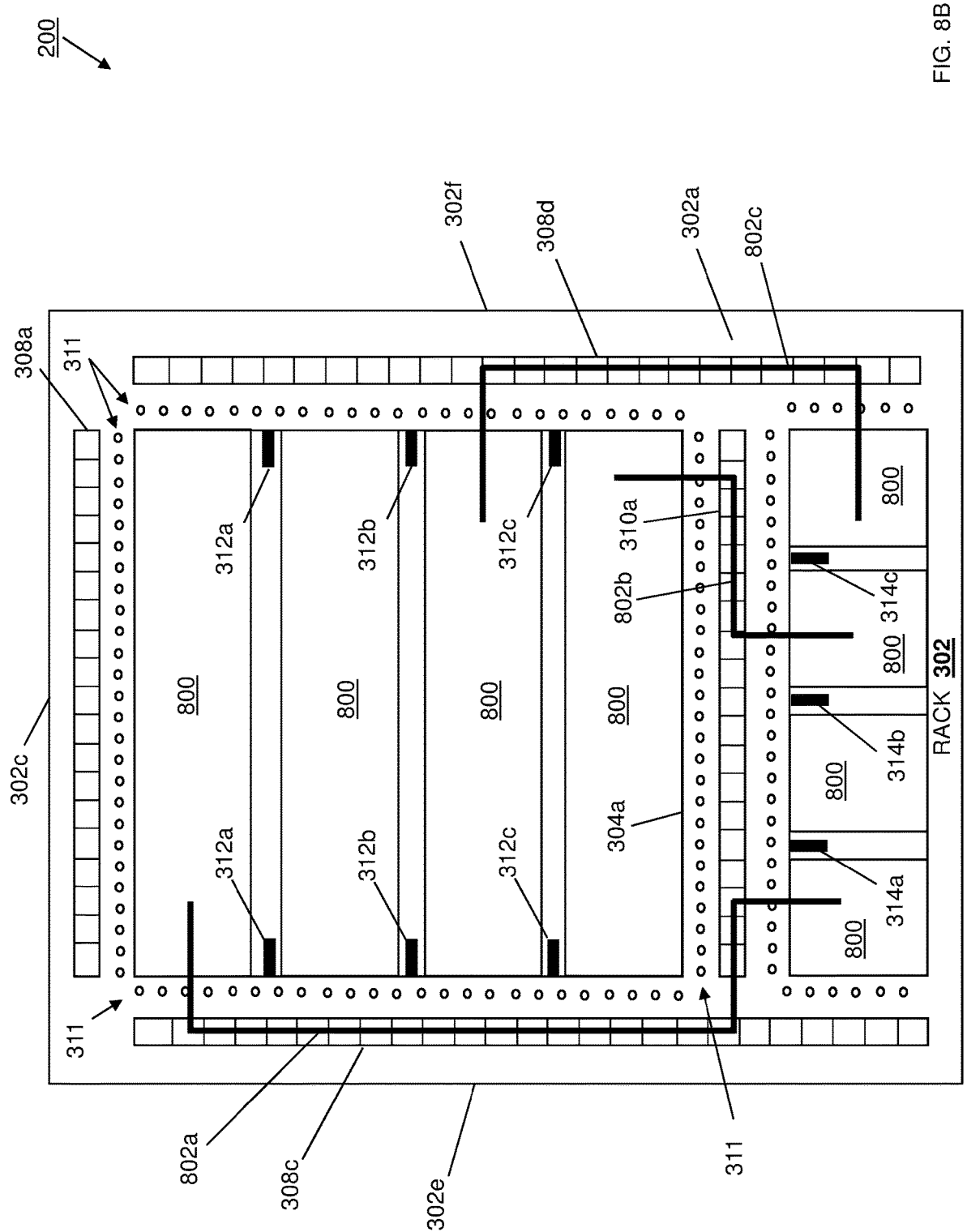
FIG. 8B is a schematic front view illustrating an embodiment of a portion of the configurable multi-orientation device mount rack system with the combination of the first/horizontal device mounting configuration and the second/vertical device mounting configuration of FIG. 8A with the plurality of devices cabled together.
Figure 8C:
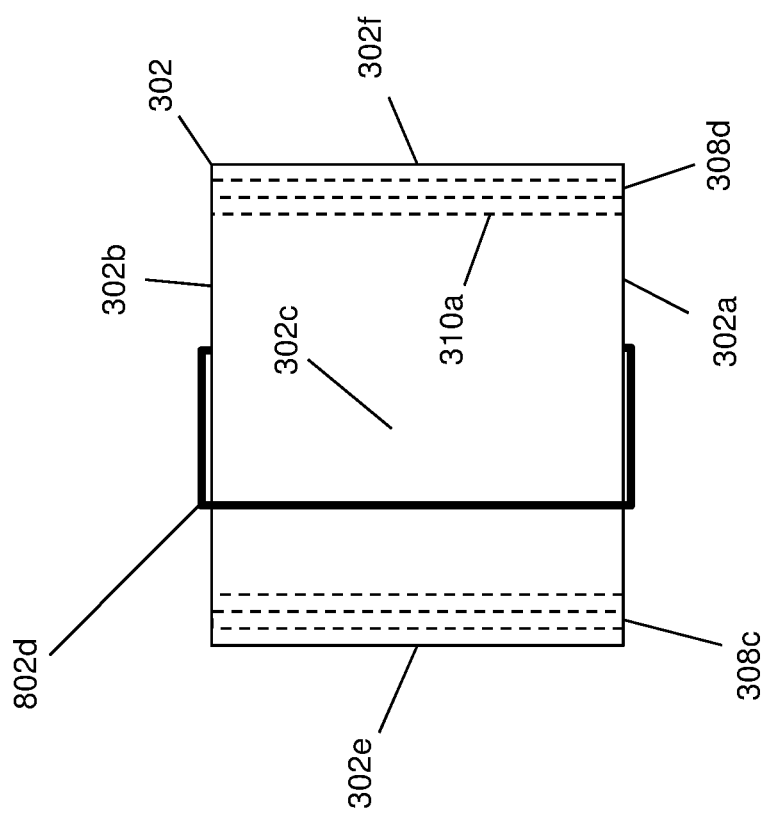
FIG. 8C is a schematic top view illustrating an embodiment of the configurable multi-orientation device mount rack system with the combination of the first/horizontal device mounting configuration and the second/vertical device mounting configuration of FIGS. 8A and 8B with devices cabled together through a depth of the rack.

Referring back to the specific example illustrated in FIGS. 8A-8C, at block 504a, each of a plurality of devices 800 may be positioned in a horizontal orientation and then moved into the device housings 306a and 306c such that they engage the device mount pairs, rack, and/or rack shelf adjacent that device housing and, once positioned in that device housing, may be secured to the rack 302 via adjacent mounting elements 311 on the rack 302. As such, a device 800 is illustrated as positioned in the device housing 306a and in engagement with the top wall 302c and side walls 302e and 302f of the rack 302 and the device mount pair 312a, a device 800 is illustrated as positioned in the device housing 306a and in engagement with the side walls 302e and 302f of the rack 302 and the device mount pairs 312a and 312b, a device 800 is illustrated as positioned in the device housing 306a and in engagement with the side walls 302e and 302f of the rack 302 and the device mount pairs 312b and 312c, and a device 800 is illustrated as positioned in the device housing 306a and in engagement with the side walls 302e and 302f of the rack 302, the device mount pair 312c, and the rack shelf 304a. Furthermore, while not described in detail, one of skill in the art in possession of the present disclosure will recognize that the devices 600 are positioned in the device housing 306c in a similar manner.

Furthermore, at block 504b, each of a plurality of devices 800 may be positioned in a vertical orientation and then moved into the device housing 306b such that they engage the device mount pairs, rack, and/or rack shelves adjacent that device housing and, once positioned in that device housing, may be secured to the rack 302 via adjacent mounting elements 311 on the rack 302. As discussed above, the securing of the devices 800 in the vertical orientation to the rack 302 may only require securing to mounting element 311 closer to the top wall 302c of the rack 302 (e.g., the "top" of that device relative to its vertical orientation), and securing to mounting elements 311 closer to the bottom wall 302d of the rack 302 (e.g., the "bottom" of that device relative to its vertical orientation) may be optional. As such, a device 800 is illustrated as positioned in the device housing 306b and in engagement with the side wall 302e of the rack 302, the device mount pair 314a, and the rack shelves 304a and 304b; a device 800 is illustrated as positioned in the device housing 306b and in engagement with the device mount pairs 314a and 314b and the rack shelves 304a and 304b; a device 800 is illustrated as positioned in the device housing 306a and in engagement with the device mount pairs 314b and 314c and the rack shelves 304a and 304b; and a device 800 is illustrated as positioned in the device housing 306a and in engagement with the side wall 302f of the rack 302, the device mount pair 314c, and the rack shelves 304a and 304b.

Figure 9A:
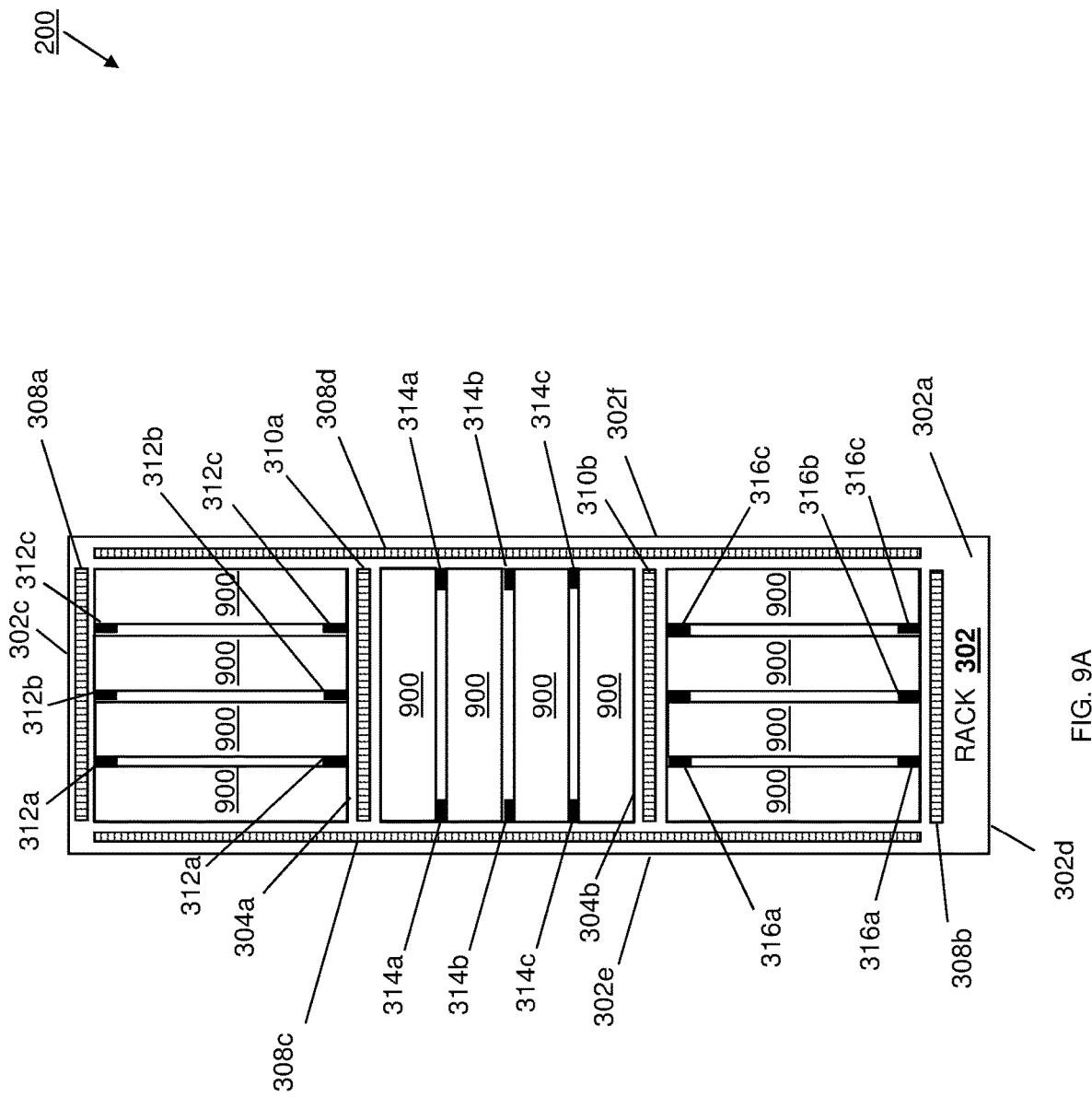
FIG. 9A is a schematic front view illustrating an embodiment of the configurable multi-orientation device mount rack system of the present disclosure with a combination of the first/horizontal device mounting configuration of FIG. 3A and the second/vertical device mounting configuration of FIG. 3D housing a plurality of devices.
Figure 9B:
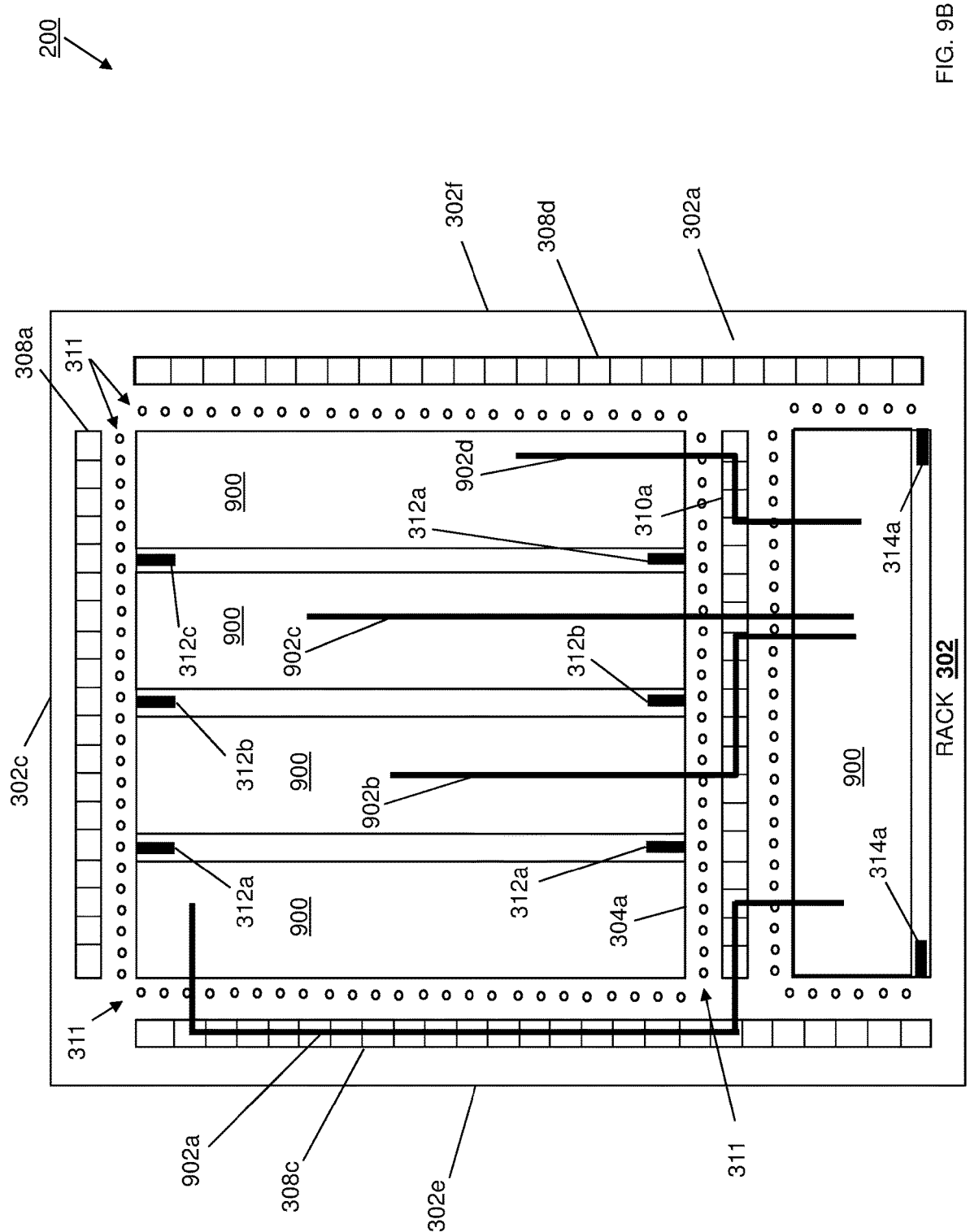
FIG. 9B is a schematic front view illustrating an embodiment of a portion of the configurable multi-orientation device mount rack system with the combination of the first/horizontal device mounting configuration and the second/vertical device mounting configuration of FIG. 8A with the plurality of devices cabled together.
Figure 9C:
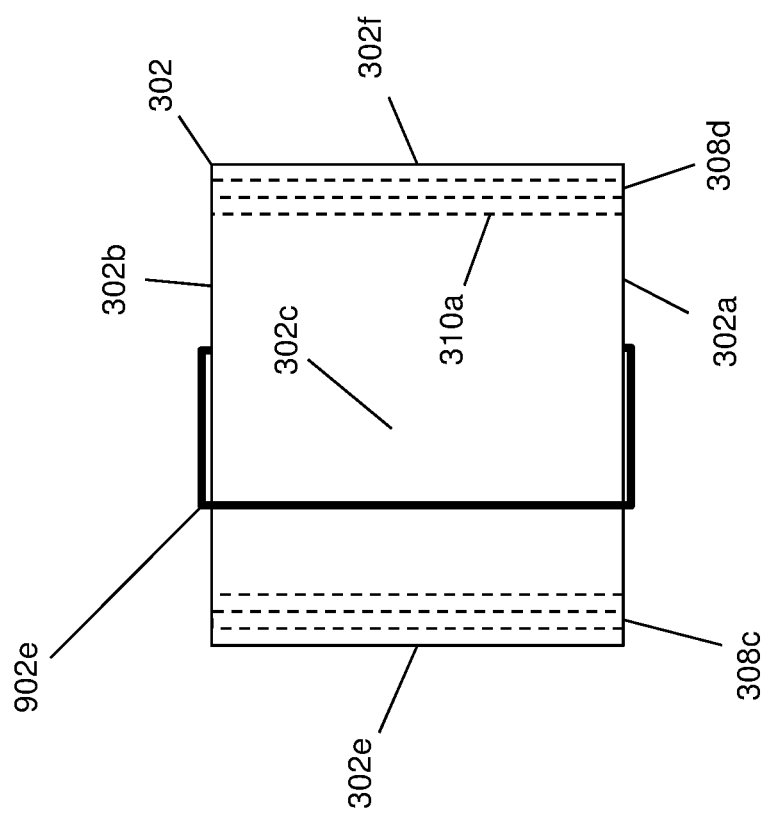
FIG. 9C is a schematic top view illustrating an embodiment of the configurable multi-orientation device mount rack system with the combination of the first/horizontal device mounting configuration and the second/vertical device mounting configuration of FIGS. 8A and 8B with devices cabled together through a depth of the rack.

Referring back to the specific example illustrated in FIGS. 9A-9C, at block 504a, each of a plurality of devices 900 may be positioned in a horizontal orientation and then moved into the device housing 306b such that they engage the device mount pairs, rack, and/or rack shelves adjacent that device housing and, once positioned in that device housing, may be secured to the rack 302 via adjacent mounting elements 311 on the rack 302. As such, a device 900 is illustrated as positioned in the device housing 306b and in engagement with the side walls 302e and 302f of the rack 302, the device mount pair 314a, and the rack shelf 304a; a device 900 is illustrated as positioned in the device housing 306b and in engagement with the side walls 302e and 302f of the rack 302 and the device mount pairs 314a and 314b; a device 900 is illustrated as positioned in the device housing 306b and in engagement with the side walls 302e and 302f of the rack 302 and the device mount pairs 314b and 314c, and a device 900 is illustrated as positioned in the device housing 306b and in engagement with the side walls 302e and 302f of the rack 302, the device mount pair 314c, and the rack shelf 304b.

Furthermore, at block 504b, each of a plurality of devices 900 may be positioned in a vertical orientation and then moved into the device housing 306b such that they engage the device mount pairs, rack, and/or rack shelves adjacent that device housing and, once positioned in that device housing, may be secured to the rack 302 via adjacent mounting elements 311 on the rack 302. As discussed above, the securing of the devices 900 in the vertical orientation to the rack 302 may only require securing to mounting element 311 closer to the top wall 302c of the rack 302 (e.g., the "top" of that device relative to its vertical orientation), and securing to mounting elements 311 closer to the bottom wall 302*d* of the rack 302 (e.g., the "bottom" of that device relative to its vertical orientation) may be optional. As such, a device 900 is illustrated as positioned in the device housing 306*a* and in engagement with the top wall 302*c* and side wall 302*e* of the rack 302, the device mount pair 312*a*, and the rack shelf 304*a*; a device 900 is illustrated as positioned in the device housing 306*a* and in engagement with the top wall 302*c* of the rack 302, the device mount pairs 312*a* and 312*b*, and the rack shelf 304*a*; a device 900 is illustrated as positioned in the device housing 306*a* and in engagement with the top wall 302*c* of the rack 302, the device mount pairs 312*b* and 312*c*, and the rack shelf 304*a*; and a device 900 is illustrated as positioned in the device housing 306*a* and in engagement with the top wall 302*c* and the side wall 302*f* of the rack 302, the device mount pair 312*c*, and the rack shelf 304*a*. Furthermore, while not described in detail, one of skill in the art in possession of the present disclosure will recognize that the devices 900 are positioned in the device housing 306*c* in a similar manner.

The method 500 then proceeds to block 506 where cables are connected to devices in the rack and routed through the rack. In an embodiment, at block 506, devices positioned in the rack 302 in the horizontal device orientation and/or the vertical device orientation may be cabled together, with those cables routed through the rack 302 using the cable management subsystems included on the rack 302. Referring back to the specific example illustrated in FIGS. 6A-6C, FIG. 6B illustrates how a cable 602*a* may be connected to the device 600 positioned in the device housing 306*b* in engagement with the side walls 302*e* and 302*f* of the rack 302, the device mount pair 314*a*, and the rack shelf 304*a*. That cable 602*a* may then be routed via the cable management subsystem 310*a* on the rack shelf 304*a* and the cable management subsystem 308*c* on the side wall 302*e* of the rack 302, and then connected to the device 600 positioned in the device housing 306*a* in engagement with the side walls 302*e* and 302*f* and top wall 302*c* of the rack and the device mount pair 312*a*.

FIG. 6B also illustrates how a cable 602*b* may be connected to the device 600 positioned in the device housing 306*b* in engagement with the side walls 302*e* and 302*f* of the rack, the device mount pair 314*a*, and the rack shelf 304*a*. That cable 602*b* may then be routed via the cable management subsystem 310*a* on the rack shelf 304*a*, and then connected to the device 600 positioned in the device housing 306*a* in engagement with the side walls 302*e* and 302*f* of the rack, the device mount pair 312*c*, and the rack shelf 304*a*. FIG. 6B also illustrates how a cable 602*c* may be connected to the device 600 positioned in the device housing 306*b* in engagement with the side walls 302*e* and 302*f* of the rack 302, the device mount pair 314*a*, and the rack shelf 304*a*. That cable 602*c* may then be routed via the cable management subsystem 308*d* on the side wall 302*f* of the rack 302, and then connected to the device 600 positioned in the device housing 306*a* in engagement with the side walls 302*e* and 302*f* of the rack and the device mount pairs 312*b* and 312*c*. Finally, FIG. 6C illustrates how a cable 602*d* may be routed through the rack 302 from the front surface 302*a* to the rear surface 302*b* via the cable management subsystem 310*a* on the rack shelf 304*a*, and one of skill in the art in possession of the present disclosure will appreciate how that cable 602*d* may connect to any two devices 600 in the rack 302. Furthermore, while the routing of a few cables between devices 600 in the rack 302 illustrated in FIGS. 6A-6C is described, one of skill in the art in possession of the present disclosure will appreciate how many more cables may be routed through that rack 302 between devices 600 while remaining within the scope of the present disclosure as well.

Referring back to the specific example illustrated in FIGS. 7A-7C, FIG. 7B illustrates how a cable 702*a* may be connected to the device 700 positioned in the device housing 306*b* in engagement with the side wall 302*e* of the rack 302, the device mount pair 314*a*, and the rack shelves 304*a* and 304*b*. That cable 702*a* may then be routed via the cable management subsystem 310*a* on the rack shelf 304*a* and the cable management subsystem 308*c* on the side wall 302*e* of the rack 302, and then connected to the device 700 positioned in the device housing 306*a* in engagement with the side wall 302*e* and top wall 302*c* of the rack, the device mount pair 312*a*, and the rack shelf 304*a*. FIG. 7B also illustrates how a cable 702*b* may be connected to the device 700 positioned in the device housing 306*b* in engagement with the device mount pairs 314*b* and 314*b* and the rack shelves 304*a* and 304*b*. That cable 702*b* may then be routed via the cable management subsystem 310*a* on the rack shelf 304*a*, and then connected to the device 700 positioned in the device housing 306*a* in engagement with the top wall 302*c* of the rack 302, the device mount pairs 312*a* and 312*b*, and the rack shelf 304*a*.

FIG. 7B also illustrates how a cable 702*c* may be connected to the device 700 positioned in the device housing 306*b* in engagement with the device mount pairs 314*b* and 314*c*, and the rack shelves 304*a* and 304*b*. That cable 702*c* may then be connected to the device 700 positioned in the device housing 306*a* in engagement with the top wall 302*c* of the rack 302, the device mount pairs 312*b* and 312*c*, and the rack shelf 304*a*. FIG. 7B also illustrates how a cable 702*d* may be connected to the device 700 positioned in the device housing 306*b* in engagement with the device mount pair 314*c*, the rack shelves 304*a* and 304*b*, and the side wall 302*f* of the rack 302. That cable 702*d* may then be routed via the cable management subsystem 308*d* on the side wall 302*f* of the rack 302, and connected to the device 700 positioned in the device housing 306*a* in engagement with the top wall 302*c* of the rack 302, the device mount pair 312*c*, and the rack shelf 304*a*. Finally, FIG. 7C illustrates how a cable 702*e* may be routed through the rack 302 from the front surface 302*a* to the rear surface 302*b* via the cable management subsystem 310*a* on the rack shelf 304*a*, and one of skill in the art in possession of the present disclosure will appreciate how that cable 702*e* may connect to any two devices 700 in the rack 302. Furthermore, while the routing of a few cables between devices 700 in the rack 302 illustrated in FIGS. 7A-7C is described, one of skill in the art in possession of the present disclosure will appreciate how many more cables may be routed through that rack 302 between devices 700 while remaining within the scope of the present disclosure as well.

Referring back to the specific example illustrated in FIGS. 8A-8C, FIG. 8B illustrates how a cable 802*a* may be connected to the device 800 positioned in the device housing 306*b* in engagement with the side wall 302*e* of the rack 302, the device mount pair 314*a*, and the rack shelves 304*a* and 304*b*. That cable 802*a* may then be routed via the cable management subsystem 310*a* on the rack shelf 304*a* and the cable management subsystem 308*c* on the side wall 302*e* of the rack 302, and then connected to the device 800 positioned in the device housing 306*a* in engagement with the side walls 302*e* and 302*f* and top wall 302*c* of the rack and the device mount pair 312*a*. FIG. 8B also illustrates how a cable 802*b* may be connected to the device 800 positioned in the device housing 306*b* in engagement with the device mount pairs 314b and 314c, and the rack shelves 304a and 304b. That cable 802b may then be routed via the cable management subsystem 310a on the rack shelf 304a, and then connected to the device 800 positioned in the device housing 306a in engagement with the side walls 302e and 302f of the rack, the device mount pair 312c, and the rack shelf 304a. FIG. 8B also illustrates how a cable 802c may be connected to the device 800 positioned in the device housing 306b in engagement with the side wall 302f of the rack 302, the device mount pair 314c, and the rack shelves 304a and 304b. That cable 802c may then be routed via the cable management subsystem 308d on the side wall 302f of the rack 302, and then connected to the device 800 positioned in the device housing 306a in engagement with the side walls 302e and 302f of the rack and the device mount pairs 312b and 312c. Finally, FIG. 8C illustrates how a cable 802d may be routed through the rack 302 from the front surface 302a to the rear surface 302b via the cable management subsystem 310a on the rack shelf 304a, and one of skill in the art in possession of the present disclosure will appreciate how that cable 802d may connect to any two devices 800 in the rack 302. Furthermore, while the routing of a few cables between devices 800 in the rack 302 illustrated in FIG. 8A87C is described, one of skill in the art in possession of the present disclosure will appreciate how many more cables may be routed through that rack 302 between devices 800 while remaining within the scope of the present disclosure as well.

Referring back to the specific example illustrated in FIGS. 9A-9C, FIG. 9B illustrates how a cable 902a may be connected to the device 900 positioned in the device housing 306b in engagement with the side walls 302e and 302f of the rack 302, the device mount pair 314a, and the rack shelf 304a. That cable 902a may then be routed via the cable management subsystem 310a on the rack shelf 304a and the cable management subsystem 308c on the side wall 302e of the rack 302, and then connected to the device 900 positioned in the device housing 306a in engagement with the side wall 302e and top wall 302c of the rack, the device mount pair 312a, and the rack shelf 304a. FIG. 9B also illustrates how a cable 902b may be connected to the device 900 positioned in the device housing 306b in engagement with the side walls 302e and 302f of the rack 302, the device mount pair 314a, and the rack shelf 304a. That cable 902b may then be routed via the cable management subsystem 310a on the rack shelf 304a, and then connected to the device 900 positioned in the device housing 306a in engagement with the top wall 302c of the rack 302, the device mount pairs 312a and 312b, and the rack shelf 304a.

FIG. 9B also illustrates how a cable 902c may be connected to the device 900 positioned in the device housing 306b in engagement with the side walls 302e and 302f of the rack 302, the device mount pair 314a, and the rack shelf 304a. That cable 702c may then be connected to the device 900 positioned in the device housing 306a in engagement with the top wall 302c of the rack 302, the device mount pairs 312b and 312c, and the rack shelf 304a. FIG. 9B also illustrates how a cable 902d may be connected to the device 900 positioned in the device housing 306b in engagement with the side walls 302e and 302f of the rack 302, the device mount pair 314a, and the rack shelf 304a. That cable 902d may then be routed via the cable management subsystem 310a on the rack shelf 304a, and connected to the device 900 positioned in the device housing 306a in engagement with the top wall 302c and the side wall 302f of the rack 302, the device mount pair 312c, and the rack shelf 304a. Finally, FIG. 9C illustrates how a cable 902e may be routed through the rack 302 from the front surface 302a to the rear surface 302b via the cable management subsystem 310a on the rack shelf 304a, and one of skill in the art in possession of the present disclosure will appreciate how that cable 902e may connect to any two devices 900 in the rack 302. Furthermore, while the routing of a few cables between devices 900 in the rack 302 illustrated in FIGS. 9A-9C is described, one of skill in the art in possession of the present disclosure will appreciate how many more cables may be routed through that rack 302 between devices 900 while remaining within the scope of the present disclosure as well While several cabling examples are discussed above, one of skill in the art in possession of the present disclosure will appreciate how devices in the rack 302 may be cabled together in any of the configurations illustrated and described above with reference to FIGS. 6A-6C, 7A-7C, 8A-8C, and 9A-9C, as well as other configurations that would be apparent to one of skill in the art in possession of the present disclosure. In some examples, devices positioned in the device housing 306b may be networking devices such as switch devices, and the centralized switch locations in the rack 302 will operate to supplement the cable management discussed above to reduce cable lengths and the blocking of ports, LEDs, airflow channels, device identification text, and other features of devices in the rack 302. Furthermore, such centralized switch locations in the rack 302 will also operate to reduce the widths of cable bundles up to 50% relative to conventional racks in which the switch devices are all located adjacent the top wall of the rack and the cable are bundled and run to the devices below the switch devices in the rack (e.g., because half the cables will be routed from the centrally located switch device(s) toward the "top" of the rack, and half of the cables will be routed from the centrally located switch device(s) toward the "bottom" of the rack). As will be appreciated by one of skill in the art in possession of the present disclosure, the cable management subsystems in the rack 302 will minimize cabling mistakes (e.g., connecting a cable to the wrong port, removing a cable from the wrong port, etc.), decrease the time necessary to add and remove cables from the rack 302, reduce cabling costs and management, reduce cable troubleshooting times, and provide a variety of other cabling-related benefits as well.

Figure 10A:
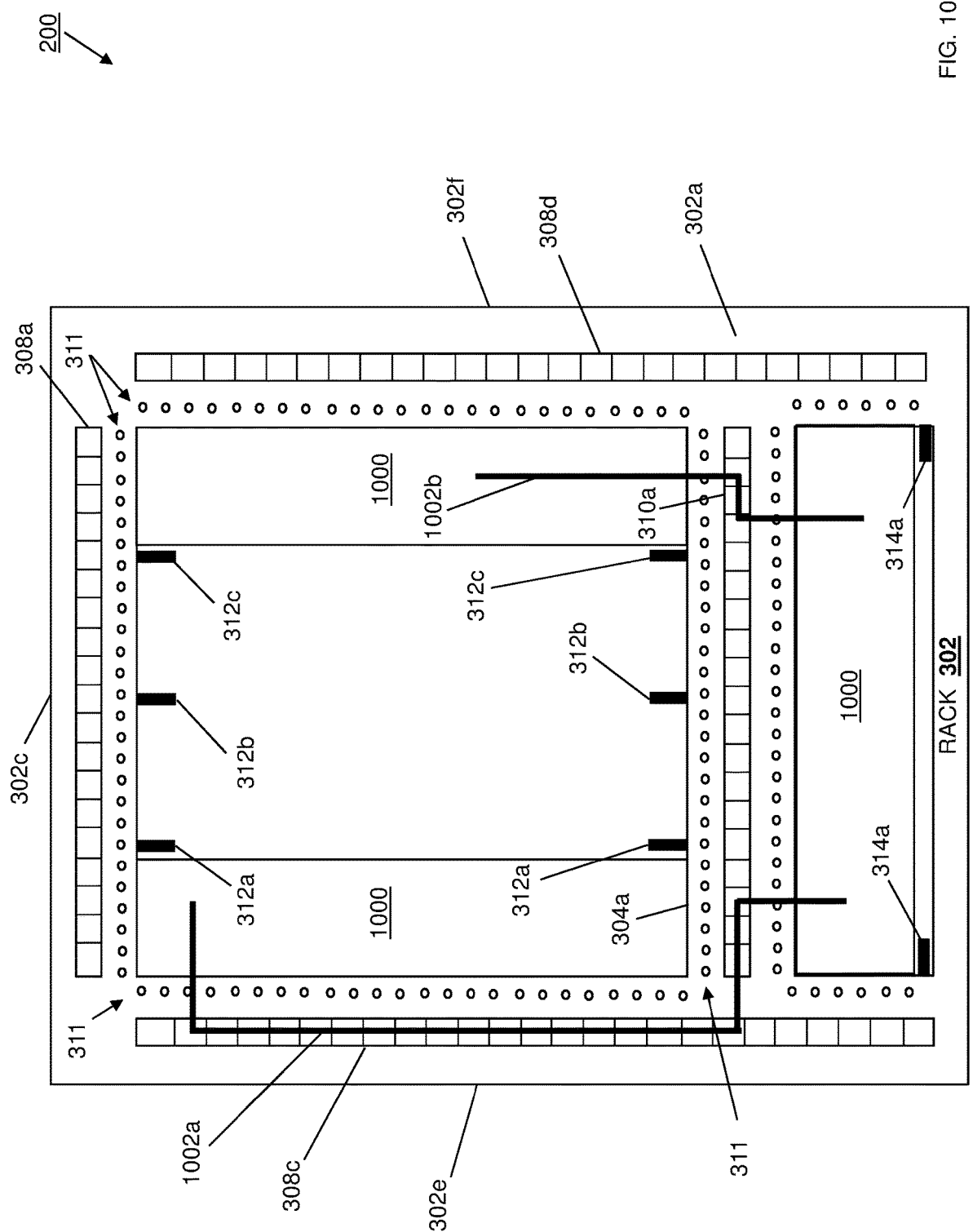
FIG. 10A is a schematic front view illustrating an embodiment of a portion of the configurable multi-orientation device mount rack system with the combination of the first/horizontal device mounting configuration and the second/vertical device mounting configuration of FIG. 9B and device cabled together.
Figure 10B:
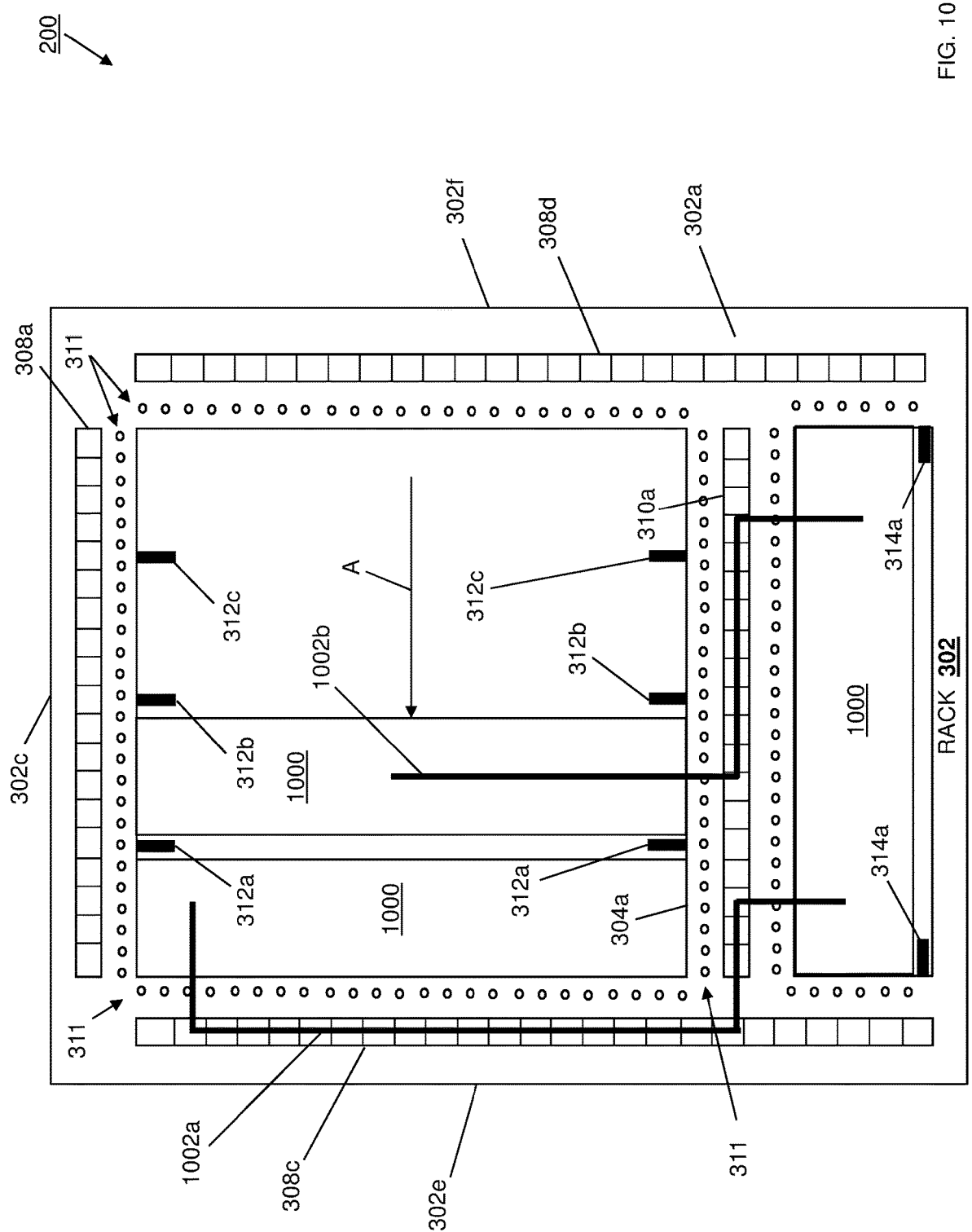
FIG. 10B is a schematic front view illustrating an embodiment of a portion of the configurable multi-orientation device mount rack system with the combination of the first/horizontal device mounting configuration and the second/vertical device mounting configuration of FIG. 10A subsequent to the movement of one of the devices that is cabled to another device.
Figure 10C:
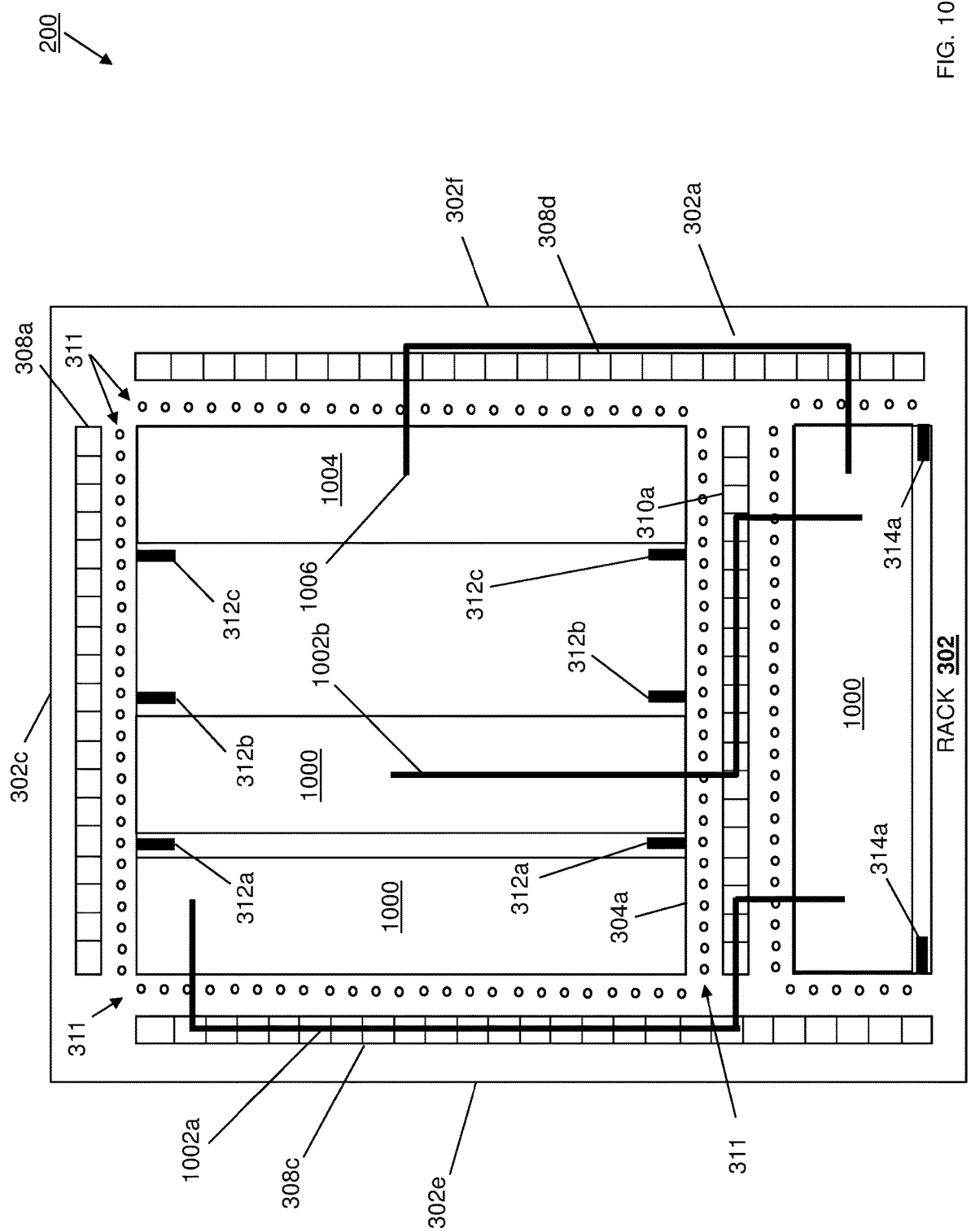
FIG. 10C is a schematic front view illustrating an embodiment of a portion of the configurable multi-orientation device mount rack system with the combination of the first/horizontal device mounting configuration and the second/vertical device mounting configuration of FIG. 10B with a device added to the rack.

For example, with reference to FIGS. 10A, 10B, and 10C, yet another benefit of the configurable multi-orientation device mount rack system 300 is illustrated. As illustrated in FIG. 10A, the rack 302 has its device housing 306a configured to house devices in the vertical device mounting orientation discussed above, and its device housing 306b configured to house devices in the horizontal device mounting orientation discussed above (e.g., similarly as discussed above with reference to FIGS. 9A, 9B, and 9C). Furthermore, a device 1000 is positioned in the device housing 306b in engagement with the side walls 302e and 302f of the rack 302, the device mount pair 314a, and the rack shelf 304a; a device 1000 is positioned in the device housing 306a in engagement with the top wall 302c and the side wall 302e of the rack 302, the device mount pair 312a, and the rack shelf 304a; and a device 1000 is positioned in the device housing 306a in engagement with the top wall 302c and the side wall 302f of the rack 302, the device mount pair 312c, and the rack shelf 304a.

Furthermore, a cable 1002a is connected to the device 1000 positioned in the device housing 306b in engagement with the side walls 302e and 302f of the rack 302, the device mount pair 314a, and the rack shelf 304a. That cable 1002a is also be routed via the cable management subsystem 310a on the rack shelf 304a and the cable management subsystem 308c in the side wall 302e of the rack 302, and connected to device 1000 positioned in the device housing 306a in engagement with the top wall 302c and the side wall 302e of the rack 302, the device mount pair 312a, and the rack shelf 304a. Similarly, a cable 1002b is connected to the device 1000 positioned in the device housing 306b in engagement with the side walls 302e and 302f of the rack 302, the device mount pair 314a, and the rack shelf 304a. That cable 1002a is also be routed via the cable management subsystem 310a on the rack shelf 304a, and connected to device 1000 positioned in the device housing 306a in engagement with the top wall 302c and the side wall 302f of the rack 302, the device mount pair 312c, and the rack shelf 304a.

As illustrated in FIGS. 10A and 10B, the device 1000 positioned in the device housing 306a in engagement with the top wall 302c and the side wall 302f of the rack 302, the device mount pair 312c, and the rack shelf 304a, may be moved in a direction A to position it in the device housing 306a in engagement with the top wall 302c of the rack 302, the device mount pairs 312a and 312b, and the rack shelf 304a. As will be appreciated by one of skill in the art in possession of the present disclosure, the movement of the device 1000 illustrated in FIG. 10B may be facilitated by removal of the device mount pairs 312b and 312c (e.g., followed by their subsequent reconnection) to allow "sliding" of the device 1000 within the device housing 306a, and may eliminate the need to disconnect the cable 1002b from that device 1000 in order to move it (e.g., in order to consolidate empty spaces in the device housing 306a). As illustrated in FIG. 10C, a device 1004 may then be positioned in the device housing 306a in engagement with the top wall 302c and the side wall 302f of the rack 302, the device mount pair 312c, and the rack shelf 304a, and a cable 1006 may be connected to the device 1000 positioned in the device housing 306b in engagement with the side walls 302e and 302f of the rack 302, the device mount pair 314a, and the rack shelf 304a, routed via the cable management subsystem 308d on the side wall 302f of the rack 302, and connected to the device 1004. As such, the vertical device orientations in the device housings in the rack 302 facilitate movement of devices within those device housings (e.g., without the need to disconnect cabling), as well as the addition of new devices in that device housing.

Thus, systems and methods have been described that provide for the configuration of multiple device housings in a rack to mount devices to the rack in either a horizontal device orientation or a vertical device orientation, along with cable management subsystems that simplify the routing of cabling through the rack and between devices. For example, the configurable multi-orientation device mount rack system of the present disclosure may include a rack having a first rack shelf. A first device housing is defined by the rack and the first rack shelf. A first device mounting subsystem is included on the rack and that is configurable to mount each of a plurality of devices in the first device housing and to the rack in a first orientation. A second device mounting subsystem is included on the first rack shelf and that is configurable to mount each of a plurality of devices in the first device housing and to the rack in a second orientation that is different than the first orientation. As such, each of a plurality of devices may be positioned in and mounted to the rack in the first device housing in either a "vertical"/side-by-side orientation or a "horizontal"/stacked orientation. As will be appreciated by one of skill in the art in possession of the present disclosure, the configurable multi-orientation device mount rack system of the present disclosure provides a user the ability to position devices in the rack in more ergonomic and efficient device orientations that allow for more efficient and ergonomic device positioned, cable routing, and device movement within the rack.

Although illustrative embodiments have been shown and described, a wide range of modification, change and substitution is contemplated in the foregoing disclosure and in some instances, some features of the embodiments may be employed without a corresponding use of other features. Accordingly, it is appropriate that the appended claims be construed broadly and in a manner consistent with the scope of the embodiments disclosed herein.

What is claimed is:

1. A configurable multi-orientation device mount rack system, comprising:
   a rack;
   a first rack shelf that is included on the rack;
   a first device housing that is defined by the rack and the first rack shelf;
   a plurality of device mount pairs that each includes a pair of respective device mounts;
   a first horizontal device mounting subsystem that includes a plurality of pairs of horizontal mounting slots that are defined by the rack on first opposing sides of the first device housing and that are each configured to receive one of the pair of respective device mounts in any of the plurality of device mount pairs to position that pair of respective device mounts in that device mount pair adjacent the first opposing sides of the first device housing in order to configure the first device housing with a plurality of first horizontal device slots that are each configured to house a respective device in the rack in a horizontal orientation via engagement of each respective device with at least one pair of respective device mounts in at least one device mount pair and the rack; and
   a first vertical device mounting subsystem that includes a plurality of pairs of vertical mounting slots that are defined by the rack and the first rack shelf on second opposing sides of the first device housing and that are each configured to receive one of the pair of respective device mounts in any of the plurality of device mount pairs to position that pair of respective device mounts in that device mount pair adjacent the second opposing sides of the first device housing in order to configure the first device housing with a plurality of first vertical device slots that are each configured to house a respective device in the rack in a vertical orientation via engagement of each respective device with at least one pair of respective device mounts in at least one device mount pair, the rack, and the first rack shelf, and wherein each pair of respective device mounts in each device mount pair is configured to be removed from the pair of vertical mounting slots in which it is located in order to allow the respective device that is positioned in a first vertical device slot provided by that device mount pair to be moved into an empty adjacent first vertical device slot provided by that device mount pair without being removed from the first device housing.

2. The system of claim 1, wherein the rack includes a first surface that defines a first device housing entrance for the first device housing, and a second surface that is located opposite the rack from the first surface and that is located adjacent the first device housing, and wherein the rack includes:

a cable management subsystem that includes a cable management channel that is configured to allow a cable to be routed through the rack from the first surface to the second surface.

3. The system of claim 1, wherein the first rack shelf includes a first surface that defines a first device housing entrance for the first device housing, and a second surface that is located opposite the first rack shelf from the first surface and that is located adjacent the first device housing, and wherein the first rack shelf includes:
   a cable management subsystem that includes a cable management channel that is configured to allow a cable to be routed through the first rack shelf from the first surface to the second surface.

4. The system of claim 1, further comprising:
   a second rack shelf that is included on the rack;
   a second device housing that is defined by the rack, the first rack shelf, and the second rack shelf;
   a second horizontal device mounting subsystem that includes a plurality of pairs of horizontal mounting slots that are defined by the rack on first opposing sides of the second device housing and that are each configured to receive one of the pair of respective device mounts in any of the plurality of device mount pairs to position that pair of respective device mounts in that device mount pair adjacent the first opposing sides of the second device housing in order to configure the second device housing with a plurality of second horizontal device slots that are each configured to house a respective device in the rack in the horizontal orientation via engagement of each respective device with at least one pair of respective device mounts in at least one device mount pair and the rack; and
   a second vertical device mounting subsystem that includes a plurality of pairs of vertical mounting slots that are defined by the first rack shelf and the second rack shelf on second opposing sides of the second device housing and that are each configured to receive one of the pair of respective device mounts in any of the plurality of device mount pairs to position that pair of respective device mounts in that device mount pair adjacent the second opposing sides of the second device housing in order to configure the second device housing with a plurality of second vertical device slots that are each configured to house a respective device in the rack in the vertical orientation via engagement of each respective device with t least one pair of respective device mounts in at least one device mount pair, the first rack shelf and the second rack shelf, and wherein each pair of respective device mounts in each device mount pair is configured to be removed from the pair of vertical mounting slots in which it is located in order to allow the respective device that is positioned in a second vertical device slot provided by that device mount pair to be moved into an empty adjacent second vertical device slot provided by that device mount pair without being removed from the first device housing.

5. The system of claim 4, wherein the second rack shelf includes a first surface that defines a second device housing entrance for the second device housing, and a second surface that is located opposite the second rack shelf from the first surface and that is located adjacent the second device housing, and wherein the second rack shelf includes:
   a cable management subsystem that includes a cable management channel that is configured to allow a cable to be routed through the second rack shelf from the first surface to the second surface.

6. The system of claim 1, wherein each respective device includes a server device, a networking device, or a storage system.

7. An Information Handling System (IHS), comprising:
   a plurality of devices;
   a rack;
   a first rack shelf that is included on the rack;
   a plurality of device mount pairs that each include a pair of respective device mounts;
   a first horizontal device mounting subsystem that includes a plurality of pairs of horizontal mounting slots that are defined by the rack and that are each configured to receive one of the pair of respective device mounts in any of the plurality of device mount pairs to position that pair of respective device mounts in that device mount pair adjacent opposite sides of the rack in order to configure the rack with a plurality of first horizontal device slots that are each configured to house a respective device in the plurality of devices between the rack and the first rack shelf in a horizontal orientation via engagement of each respective device in the plurality of devices with at least one pair of respective device mounts in at least one device mount pair and the rack; and
   a first vertical device mounting subsystem that includes a plurality of pairs of vertical mounting slots that are defined by the rack and the first rack shelf and that are each configured to receive one of the pair of respective device mounts in any of the plurality of device mount pairs to position that pair of respective device mounts in that device mount pair adjacent the rack and the first rack shelf in order to configure the rack with a plurality of first vertical device slots that are each configured to house a respective device in the plurality of devices between the rack and the first rack shelf in a vertical orientation via engagement of each respective device in the plurality of devices with at least one pair of respective device mounts in at least one device mount pair, the rack, and the first rack shelf, and wherein each pair of respective device mounts in each device mount pair is configured to be removed from the pair of vertical mounting slots in which it is located in order to allow the respective device that is positioned in a first vertical device slot provided by that device mount pair to be moved into an empty adjacent first vertical device slot provided by that device mount pair without being removed from the first device housing.

8. The IHS of claim 7, wherein the rack includes a first surface that defines a device entrance for the rack, and a second surface that is located opposite the rack from the first surface, and wherein the rack includes:
   a cable management subsystem that includes a cable management channel that is configured to allow a cable to be routed through the rack from the first surface to the second surface.

9. The IHS of claim 7, wherein the first rack shelf includes a first surface that defines a device entrance for the rack, and a second surface that is located opposite the first rack shelf from the first surface, and wherein the first rack shelf includes:
   a cable management subsystem that includes a cable management channel that is configured to allow a cable to be routed through the first rack shelf from the first surface to the second surface.

10. The IHS of claim 7, further comprising:
    a second rack shelf that is included on the rack;

a second horizontal device mounting subsystem that includes a plurality of pairs of horizontal mounting slots that are defined by the rack and that are each configured to receive one of the pair of respective device mounts in any of the plurality of device mount pairs to position that pair of respective device mounts in that device mount pair adjacent opposite sides of the rack in order to configure the rack with a plurality of second horizontal device slots that are each configured to house a respective device in the plurality of devices between the rack, the first rack shelf, and the second rack shelf in the horizontal orientation via engagement of each respective device in the plurality of devices with at least one pair of respective device mounts in at least one device mount pair and the rack; and a second vertical device mounting subsystem that includes a plurality of pairs of vertical mounting slots that are defined by the first rack shelf and the second rack shelf and that are each configured to receive one of the pair of respective device mounts in any of the plurality of device mount pairs to position that pair of respective device mounts in that device mount pair adjacent the first rack shelf and the second rack shelf in order to configure the rack with a plurality of second vertical device slots that are each configured to house a respective device in the plurality of devices between the rack, the first rack shelf, and the second rack shelf in the vertical orientation via engagement of each respective device in the plurality of devices with at least one pair of respective device mounts in at least one device mount pair, the first rack shelf and the second rack shelf, and wherein each pair of respective device mounts in each device mount pair is configured to be removed from the pair of vertical mounting slots in which it is located in order to allow the respective device that is positioned in a second vertical device slot provided by that device mount pair to be moved into an empty adjacent second vertical device slot provided by that device mount pair without being removed from the second device housing.

11. The IHS of claim 10, wherein the second rack shelf includes a first surface that defines a device entrance for the rack, and a second surface that is located opposite the second rack shelf from the first surface, and wherein the second rack shelf includes:

a cable management subsystem that includes a cable management channel that is configured to allow a cable to be routed from through the second rack shelf from the first surface to the second surface.

12. The IHS of claim 7, wherein the first device housing is configured to allow each respective device in the plurality of devices to be slid between adjacent first vertical device slots without being removed from the first device housing when the pair of respective device mounts that defines those adjacent first vertical device slots is removed from the pair of vertical mounting slots in which they were received.

13. The IHS of claim 7, wherein the plurality of devices include at least one server device, at least one networking device, and at least one storage system.

14. A method for mounting devices in multiple orientations in a rack, comprising:

receiving, by each of a plurality of pairs of horizontal mounting slots in a first horizontal device mounting subsystem that are defined by a rack on first opposing sides of a first device housing defined between the rack and a first rack shelf that is included on the rack, respective pairs of device mounts in each of a plurality of device mount pairs to position the respective pairs of device mounts in each of the plurality of device mount pairs adjacent the first opposing sides of the first device housing in order to configure the first device housing with a plurality of first horizontal device slots;

housing a plurality of first devices in a horizontal orientation in respective first horizontal device slots in the first device housing in the rack via engagement of each of the plurality of first devices with at least one of the respective pairs of device mounts in the plurality of device mount pairs and the rack;

removing the plurality of first devices from the first device housing in the rack;

receiving, by each of a plurality of pairs of vertical mounting slots in a first vertical device mounting subsystem that are defined by the rack and the first rack shelf on second opposing sides of the first device housing, respective pairs of the device mounts in each of the plurality of device mount pairs to position the respective pairs of device mounts in each of the plurality of device mount pair adjacent the second opposing sides of the first device housing in order to configure the second device housing with a plurality of first vertical device slots;

housing at least one of the plurality of first devices in a vertical orientation in respective first vertical device slots in the first device housing in the rack via engagement of each of the at least one of the plurality of first devices with at least one of the respective pairs of device mounts in the plurality of device mount pairs, the rack, and the first rack shelf;

removing a first pair of device mounts in a first device mount pair from a first pair of vertical mounting slots in which they are located;

moving the first device that is positioned in a first vertical device slot that was provided by the first device mount pair into an empty adjacent first vertical device slot that was provided by the first device mount pair without removing that first device from the first device housing.

15. The method of claim 14, wherein the rack includes a first surface that defines a first device housing entrance for the first device housing, and a second surface that is located opposite the rack from the first surface and that is located adjacent the first device housing, and wherein the method further comprises:

routing, via a cable management channel included in a cable management subsystem in the rack, a cable through the rack from the first surface to the second surface.

16. The method of claim 14, wherein the first rack shelf includes a first surface that defines a first device housing entrance for the first device housing, and a second surface that is located opposite the first rack shelf from the first surface and that is located adjacent the first device housing, and wherein the method further comprises:

routing, via a cable management channel included in a cable management subsystem in the first rack shelf, a cable through the rack from the first surface to the second surface.

17. The method of claim 14, further comprising:

receiving, by each of a plurality of pairs of horizontal mounting slots in a second horizontal device mounting subsystem that are defined by the rack on first opposing sides of a second device housing defined between the rack, the first rack shelf, and a second rack shelf that is included on the rack, respective pairs of device mounts in each of the plurality of device mount pairs to position the respective pairs of device mounts in each of the plurality of device mount pairs adjacent the first opposing sides of the second device housing in order to configure the second device housing with a plurality of second horizontal device slots;

housing a plurality of second devices in the horizontal orientation in the second device housing in the rack via engagement of each of the plurality of second devices with at least one of the respective pairs of device mounts in the plurality of device mount pairs and the rack;

removing the plurality of second devices from the second device housing in the rack;

receiving, by each of a plurality of pairs of vertical mounting slots in a second vertical device mounting subsystem that are defined by the first rack shelf and the second rack shelf on second opposing sides of the second device housing, respective pairs of the device mounts in each of the plurality of device mount pairs to position the respective pairs of device mounts in each of the plurality of device mount pairs adjacent the second opposing sides of the second device housing in order to configure the second device housing with a plurality of second vertical device slots;

housing at least one of the plurality of second devices in respective second vertical device slots in the vertical orientation in the second device housing in the rack via engagement of each of the at least one of the plurality of second devices with at least one of the respective pairs of device mounts in the plurality of device mount pairs, the first rack shelf and the second rack shelf;

removing a second pair of device mounts in a second device mount pair from a second pair of vertical mounting slots in which they are located;

moving the first device that is positioned in a second vertical device slot that was provided by the second device mount pair into an empty adjacent second vertical device slot that was provided by the second device mount pair without removing that first device from the second device housing.

18. The method of claim 17, wherein the second rack shelf includes a first surface that defines a second device housing entrance for the second device housing, and a second surface that is located opposite the second rack shelf from the first surface and that is located adjacent the second device housing, and wherein the method further comprises:

routing, via a cable management channel included in a cable management subsystem in the second rack shelf, a cable through the rack from the first surface to the second surface.

19. The method of claim 14, further comprising:

moving, via the first device housing, one of the first devices to be slid between adjacent first vertical device slots without being removed from the first device housing when the pair of respective device mounts that defines those adjacent first vertical device slots is removed from the pair of vertical mounting slots in which they were received.

20. The method of claim 14, wherein the plurality of first devices include at least one of: a server device, a networking device, and a storage system.

\* \* \* \* \*